(12) United States Patent
Rudolph

(10) Patent No.: US 8,236,479 B2
(45) Date of Patent: *Aug. 7, 2012

(54) METHOD FOR PRINTING A PATTERN ON A SUBSTRATE

(75) Inventor: Michael Lee Rudolph, Newark, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 539 days.

This patent is subject to a terminal disclaimer.

(21) Appl. No.: 12/349,608

(22) Filed: Jan. 7, 2009

(65) Prior Publication Data

US 2009/0186308 A1 Jul. 23, 2009

Related U.S. Application Data

(60) Provisional application No. 61/062,218, filed on Jan. 23, 2008.

(51) Int. Cl.
*G03F 7/00* (2006.01)
*G03F 7/26* (2006.01)
*G03C 1/00* (2006.01)

(52) U.S. Cl. ..................... 430/306; 430/281.1

(58) Field of Classification Search ............... 430/281.1, 430/306
See application file for complete search history.

(56) References Cited

U.S. PATENT DOCUMENTS

| | | | |
|---|---|---|---|
| 2,927,024 A | 3/1960 | Woodward et al. |
| 3,060,023 A | 10/1962 | Burg et al. |
| 3,144,331 A | 8/1964 | Thommes |
| 3,264,103 A | 8/1966 | Cohen et al. |
| 3,796,602 A | 3/1974 | Briney et al. |
| 4,045,231 A | 8/1977 | Toda et al. |
| 4,177,074 A | 12/1979 | Proskow |
| 4,323,636 A | 4/1982 | Chen |
| 4,323,637 A | 4/1982 | Chen et al. |
| 4,427,759 A | 1/1984 | Gruetzmacher et al. |
| 4,430,417 A | 2/1984 | Heinz et al. |
| 4,431,723 A | 2/1984 | Proskow |
| 4,460,675 A | 7/1984 | Gruetzmacher et al. |
| 4,517,279 A | 5/1985 | Worns |

(Continued)

FOREIGN PATENT DOCUMENTS

EP 0 017 927 B1 10/1980

(Continued)

OTHER PUBLICATIONS

B. Taylor, R. Fan, G. Blanchet, "The Digital Difference", FLEXO™ Magazine, Jul. 1997.

(Continued)

*Primary Examiner* — Cynthia Kelly
*Assistant Examiner* — Connie P Johnson

(57) ABSTRACT

A pattern of ink is printed on a substrate, such as corrugated paperboard with a relief printing form made from a photosensitive element. An in-situ mask is formed for the photosensitive element, the element is exposed to actinic radiation through the in-situ mask in an environment having an inert gas and a concentration of oxygen between 190,000 and 100 ppm, and the exposed element is treated to form the relief printing form having a pattern of printing areas. Printing is accomplished by securing the relief printing form to a print press, applying the ink to the printing areas on the printing form, and contacting the ink from the printing areas to the substrate to transfer the pattern of ink onto the substrate.

18 Claims, 4 Drawing Sheets

U.S. PATENT DOCUMENTS

| | | | |
|---|---|---|---|
| 4,540,649 A | 9/1985 | Sakurai | |
| 4,726,877 A | 2/1988 | Fryd et al. | |
| 4,753,865 A | 6/1988 | Fryd et al. | |
| 4,806,506 A | 2/1989 | Gibson, Jr. | |
| 4,894,315 A | 1/1990 | Feinberg et al. | |
| 4,942,111 A | 7/1990 | Wade et al. | |
| 4,956,252 A | 9/1990 | Fryd et al. | |
| 5,015,556 A | 5/1991 | Martens | |
| 5,175,072 A | 12/1992 | Martens | |
| 5,215,859 A | 6/1993 | Martens | |
| 5,262,275 A | 11/1993 | Fan | |
| 5,279,697 A | 1/1994 | Peterson et al. | |
| 5,301,610 A | 4/1994 | McConnell | |
| 5,330,882 A | 7/1994 | Kawaguchi et al. | |
| 5,385,611 A | 1/1995 | Matsumoto et al. | |
| 5,486,384 A | 1/1996 | Bastian et al. | |
| 5,506,086 A | 4/1996 | Van Zoeren | |
| 5,516,626 A | 5/1996 | Ohmi et al. | |
| 5,607,814 A | 3/1997 | Fan et al. | |
| 5,645,974 A | 7/1997 | Ohta et al. | |
| 5,654,125 A | 8/1997 | Fan et al. | |
| 5,679,485 A | 10/1997 | Suzuki et al. | |
| 5,688,633 A | 11/1997 | Leach | |
| 5,705,310 A | 1/1998 | Van Zoeren | |
| 5,707,773 A | 1/1998 | Grossman et al. | |
| 5,719,009 A | 2/1998 | Fan | |
| 5,760,880 A | 6/1998 | Fan et al. | |
| 5,766,819 A | 6/1998 | Blanchet-Fincher | |
| 5,798,019 A | 8/1998 | Cushner et al. | |
| 5,830,621 A | 11/1998 | Suzuki et al. | |
| 5,840,463 A | 11/1998 | Blanchet-Fincher | |
| 5,863,704 A | 1/1999 | Sakurai et al. | |
| 5,888,701 A | 3/1999 | Fan | |
| 6,037,102 A | 3/2000 | Loerzer et al. | |
| 6,185,840 B1 | 2/2001 | Noelle et al. | |
| 6,238,837 B1 | 5/2001 | Fan | |
| 6,284,431 B1 | 9/2001 | Tanizaki et al. | |
| 6,558,876 B1 | 5/2003 | Fan | |
| 6,673,509 B1 | 1/2004 | Metzger | |
| 6,766,740 B1 | 7/2004 | Wier | |
| 6,773,859 B2 | 8/2004 | Fan et al. | |
| 6,797,454 B1 | 9/2004 | Johnson et al. | |
| 6,929,898 B2 | 8/2005 | Fan | |
| 7,105,206 B1 | 9/2006 | Beck et al. | |
| 7,348,123 B2 | 3/2008 | Mengel et al. | |
| 2002/0115019 A1 | 8/2002 | Kaczun et al. | |
| 2003/0211419 A1 | 11/2003 | Fan | |
| 2004/0048199 A1 | 3/2004 | Schadebrodt et al. | |
| 2004/0234886 A1 | 11/2004 | Rudolph et al. | |
| 2004/0259033 A1 | 12/2004 | Kunita | |
| 2005/0142480 A1 | 6/2005 | Bode et al. | |
| 2005/0231708 A1 | 10/2005 | Sunagawa et al. | |
| 2005/0266358 A1 | 12/2005 | Roberts et al. | |
| 2006/0016355 A1 | 1/2006 | Saai et al. | |
| 2006/0055761 A1 | 3/2006 | Daems et al. | |
| 2006/0105268 A1 | 5/2006 | Vest | |
| 2006/0144272 A1 | 7/2006 | Haraguchi et al. | |
| 2008/0063979 A1 | 3/2008 | Tomita et al. | |
| 2010/0218694 A1* | 9/2010 | Wier et al. | 430/306 |

FOREIGN PATENT DOCUMENTS

| | | |
|---|---|---|
| EP | 0 741 330 A1 | 11/1996 |
| EP | 0 891 877 A2 | 1/1999 |
| EP | 0 945 753 A | 9/1999 |
| EP | 1 160 627 A | 12/2001 |
| JP | 53-008655 | 1/1978 |
| NL | 8 900 784 A | 10/1990 |
| WO | WO 92/21518 | 12/1992 |
| WO | WO 2005/026836 A | 3/2005 |
| WO | WO 2008/034810 A2 | 3/2008 |
| WO | WO 2009/033124 A | 3/2009 |

OTHER PUBLICATIONS

U.S. Appl. No. 12/346,608, filed Jan. 7, 2009, Rudolph.

Flexography: Principles and Practice, Ronkonkoma, New York—4th Edition and 5th Edition, 1999, Chapters 8-12, pp. 103-379, (Chapter 8, pp. 103-147; Chapter 9, pp. 149-177; Chapter 10, pp. 181-288; Chapter 11, pp. 289-318; Chapter 12, pp. 319-376).

* cited by examiner

METHOD FOR PRINTING A PATTERN ON A SUBSTRATE

BACKGROUND OF THE INVENTION

1. Field of the Disclosure

This invention pertains to a method for printing a pattern on a substrate, and in particular, a method for printing a pattern of ink on a corrugated paperboard substrate.

2. Description of Related Art

Flexographic printing plates are widely used for printing of packaging materials including corrugated carton boxes, cardboard boxes, continuous web of paper, and continuous web of plastic films. Flexographic printing plates are a form of relief printing in which ink is carried from a raised-image surface and transferred to a substrate. Flexographic printing plates can be prepared from photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a solid layer of the photopolymerizable composition interposed between a support and a coversheet or a multilayer cover element.

Flexographic printing forms are characterized by their ability to crosslink or cure upon exposure to actinic radiation. Typically, the printing form precursor is uniformly exposed through its backside, i.e., backflashed, to a specified amount of actinic radiation to form a floor, and is imagewise exposed through its front side with the same actinic radiation that was used for the backflash exposure. The imagewise exposure can be through an image-bearing art-work or a phototool, such as a photographic negative or transparency (e.g. silver halide film), that is held in intimate contact under vacuum to the photopolymerizable layer, so called analog workflow. Alternatively, imagewise exposure can be through an in-situ mask having radiation opaque areas and transparent areas that had been previously formed above the photopolymerizable layer, so called digital workflow. The precursor is exposed to actinic radiation, such as ultraviolet (UV) radiation, to selectively cure the photopolymerizable layer. The actinic radiation enters the photosensitive element through the transparent areas and is blocked from entering the photopolymerizable layer by the black or opaque areas of the transparency or in-situ mask. The areas of the photopolymerizable layer that are exposed to the actinic radiation cure or hardened and crosslink. The unexposed areas of the photopolymerizable layer that were under the opaque regions of the transparency or in-situ mask during exposure do not crosslink or cure (i.e., harden). The uncured regions are soluble to solvents used during washout development and/or can melt, soften, or flow upon heating. The plate is then subjected to a processing step wherein the unexposed areas (i.e., uncured areas) are removed by treating with a washout solution or heat leaving a relief image suitable for printing. If treated with washout solutions, the plate is subsequently dried to remove solvents that may be absorbed by the plate. The printing plate can be further exposed to UV radiation to ensure complete polymerization and to remove surface tackiness. After all desired processing steps, the plate is then mounted on printing press to print the formed relief image onto a substrate.

Analog workflow requires the preparation of the phototool, which is a complicated, costly and time-consuming process requiring separate processing equipment and chemical development solutions. In addition, the phototool may change slightly in dimension due to changes in temperature and humidity. The same phototool, when used at different times or in different environments, may give different results. Since a phototool is created for each printing plate according to the color of ink being printed in a multicolor image, dimensional instability of the phototool can result in the mis-registration of multicolor images during printing. Use of a phototool also requires special care and handling when fabricating flexographic printing forms to ensure intimate contact is maintained between the phototool and plate. In particular, care is required in the placement of both the phototool and the plate in the exposure apparatus along with special materials to minimize air entrapment during creation of a vacuum to ensure intimate contact. Additionally care must be taken to ensure all surfaces of the photopolymer plate and phototool are clean and free of dust and dirt. Presence of such foreign matter can cause lack of intimate contact between the phototool and plate as well as image artifacts.

An alternative to analog workflow is termed digital workflow, which does not require the preparation of a separate phototool. Photosensitive elements suitable for use as the precursor capable of forming the in-situ mask in digital workflow are described in U.S. Pat. No. 5,262,275; U.S. Pat. No. 5,719,009; U.S. Pat. No. 5,607,814; U.S. Pat. No. 6,238,837; U.S. Pat. No. 6,558,876; U.S. Pat. No. 6,929,898; U.S. Pat. No. 6,673,509; U.S. Pat. No. 5,607,814; U.S. Pat. No. 6,037,102; and U.S. Pat. No. 6,284,431. The precursor or an assemblage with the precursor includes a layer sensitive to infrared radiation and opaque to actinic radiation. The infrared-sensitive layer is imagewise exposed with laser radiation whereby the infrared-sensitive material is removed from, or transferred onto/from a superposed film of the assemblage, to form the in-situ mask having radiation opaque areas and clear areas adjacent the photopolymerizable layer. The precursor is exposed through the in-situ mask to actinic radiation in the presence of atmospheric oxygen (since no vacuum is needed). Furthermore, due in part to the presence of atmospheric oxygen during main exposure the flexographic printing form has a relief structure that is different from the relief structure formed in analog workflow (based upon the same size mask openings in both workflows). Digital workflow results in the relief image having a different structure of the raised surface areas. In particular, the fine raised surface of dots (i.e., the individual elements of a halftone image) is typically smaller, with a rounded top, and a curved sidewall profile, which is often referred to as dot sharpening effect. Dots produced by analog workflow are typically conical and have a flat-top. The relief structure formed by digital workflow results in positive printing properties such as, finer printed highlight dots fading into white, increased range of printable tones, and sharp linework. As such, the digital workflow because of its ease of use and desirable print performance has gained wide acceptance as a desired method by which to produce the flexographic printing form.

It is known by those skilled in the art that the presence of oxygen ($O_2$) during exposure in free-radical photopolymerization processes will induce a side reaction in which the free radical molecules react with the oxygen, while the primary reaction between reactive monomer molecules occurs. This side reaction is known as inhibition (i.e., oxygen inhibition) as it slows down the polymerization or formation of crosslinked molecules. Many prior disclosures acknowledge that it is desirable for photopolymerization exposure to actinic radiation to occur in air (as is the case for digital workflow), under vacuum (as is the case for analog workflow), or in an inert environment. Oftentimes, nitrogen is mentioned as a suitable inert gas for the inert environment. The implication is that the nitrogen environment is one that contains substantially less than atmospheric oxygen to the extent that all oxygen is removed, or something less than about 10 ppm of oxygen. Nitrogen with oxygen impurity concentration level less than 10 ppm is readily commercially available.

A commercially important substrate for packaging graphics printing is corrugated paperboard. Corrugated paperboard includes a corrugating medium, which is a layer of pleated or multi-grooved paperboard typically called flute, adjacent a flat paper or paper-like layer referred to as liner. A typical embodiment of corrugated paperboard includes the flute layer sandwiched between two liner layers. Other embodiments of corrugated paperboard can include multiple layers of flute and liner. The fluted interlayer provides structural rigidity to the corrugated board. Since corrugated paperboard is used as packaging and formed into boxes and containers, the liner layer forming an exterior surface of the corrugated paperboard is frequently printed with the necessary identifying information for the package. The exterior liner layer often has slight indentations due to the uneven support of the underlying flute layer. A problem often encountered with printing onto corrugated board substrates is the occurrence of a printing effect that is typically referred to as fluting or banding, and can also be called striping or washboarding. Fluting typically occurs when post printing, that is printing the liner on the exterior surface of the corrugated paperboard, after the corrugated paperboard has been assembled. The fluting effect manifests as regions of dark printing, i.e., bands of higher density, alternating with regions of light printing, i.e., bands of lower (or less than high) density, that correspond to the underlying fluting structure of the corrugated board. The darker printing occurs where uppermost portions of the pleated interlayer structure support the printing surface of the liner. The fluting effect can be apparent in areas of a printed image having tones or tint values where the inked areas represent a fraction of the total area, as well as, in areas of the printed image where the ink coverage is complete or a solid. However, this fluting effect is found to be more pronounced when printing with a relief printing form that was produced using the digital workflow.

So a need arises for a flexographic printing form that can be produced from a photosensitive element (precursor) with the ease of digital workflow process, but has a relief structure that eliminates or reduces fluting density variations in the printed image when printing on corrugated board.

SUMMARY OF THE INVENTION

The present invention provides a method for printing a pattern of ink on a corrugated paperboard substrate comprising providing a relief printing form from a photosensitive element. The photosensitive element comprises a photopolymerizable layer containing a binder, an ethylenically unsaturated compound and a photoinitiator. The relief printing form is prepared with steps comprising i) forming an in-situ mask adjacent the photopolymerizable layer; ii) exposing the photopolymerizable layer to actinic radiation through the mask in an environment having an inert gas and a concentration of oxygen between 190,000 ppm and 100 ppm; and iii) treating the element from step ii) to form the relief printing form having a pattern of printing areas. The printing method comprises securing the printing form onto or adjacent a print cylinder, applying the ink to the printing areas of the printing form, and contacting the ink from the printing areas to the substrate, thereby transferring the pattern of ink onto the substrate.

BRIEF DESCRIPTION OF THE DRAWINGS

FIG. 4A represents a curve of a cumulative sum of an area relative to height of a raised surface of a printing form prepared by analog workflow. FIG. 4B represents a curve of a cumulative sum of an area relative to height of a raised surface of a printing form prepared by conventional digital workflow (exposure in presence of atmospheric oxygen). FIG. 4C represents a curve of a cumulative sum of an area relative to height of a raised surface of a printing form prepared according to the present invention with a modified digital workflow in which exposure is an environment of an inert gas and a concentration of oxygen between 190,000 and 100 parts per million (ppm).

DESCRIPTION OF THE PREFERRED EMBODIMENT(S)

Figure 1:
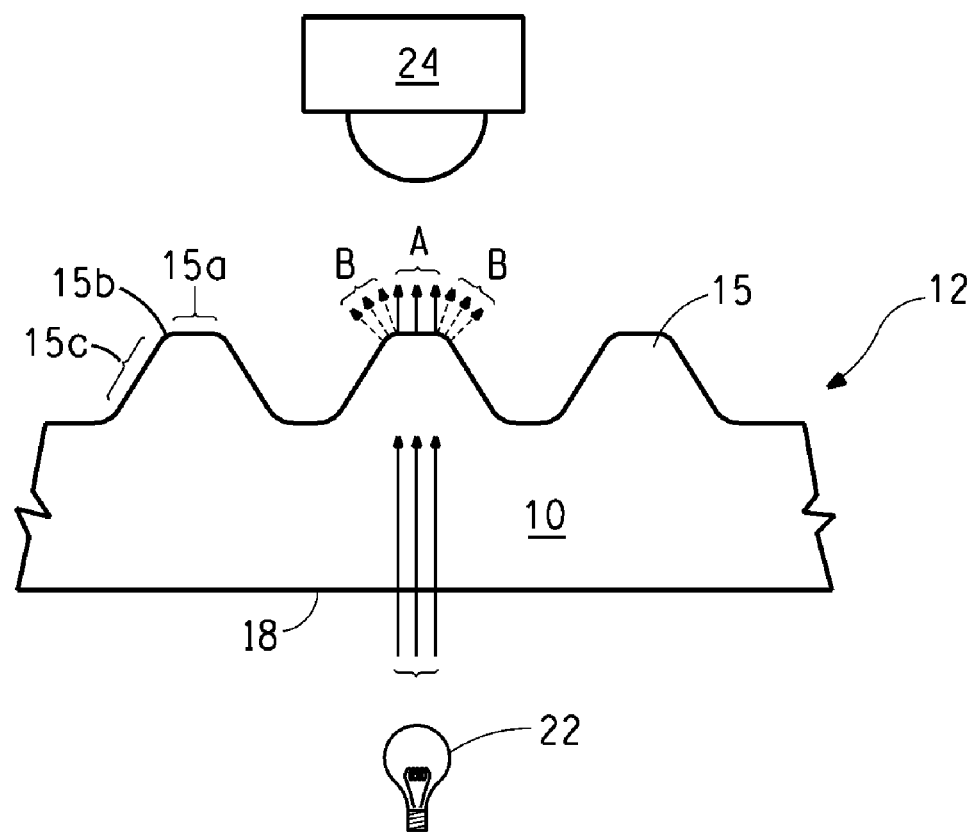
FIG. 1 is a schematic representation of a cross-section of a relief printing form having raised surfaces, in an optical device for determining an area of the raised surface.

Throughout the following detailed description, similar reference characters refer to similar elements in all figures of the drawings.

The present invention is a method for printing a pattern of ink on corrugated paperboard, using a relief printing form made from a photosensitive element having an in-situ mask. The photosensitive element is a photopolymerizable printing element having a layer of a photopolymerizable composition that includes binder, monomer, and a photoinitiator, on a support. The relief printing form has a pattern of printing areas that is formed by imagewise exposure of the photosensitive element to actinic radiation in an environment having an inert gas and a concentration of oxygen between 190,000 parts per million (ppm) and 100 ppm. Imagewise exposure of the photosensitive element in the environment having the inert gas and the particular oxygen content provides the printing form with a plurality of raised surfaces each with top surface area for carrying ink, a side-wall surface area, and a shoulder surface area that transitions between the top surface area and the side-wall surface area, and has a total printing area that is the sum of the top surface area and the shoulder surface area. It has surprisingly and unexpectedly been found that when the shoulder surface area increases a radius of the top printing surface area by less than or equal to about 10%, fluting or banding effect of an image printed by the relief printing form on corrugated paperboard is at least minimized. It has surprisingly and unexpectedly been found that when the shoulder surface area increases a radius of the top printing surface area by less than or equal to about 10 microns (for a 155 micron diameter dot raised surface), fluting or banding effect of an image printed by the relief printing form on corrugated paperboard is reduced. It has surprisingly and unexpectedly been found that a printing form prepared according to the present method provides a printing area of the raised surface in which the shoulder surface area increases a radius of the top printing surface area by less than or equal to about 2.5% significantly reduces fluting or banding effect of an image printed by the relief printing form on corrugated paperboard. It has been found that when the shoulder surface area represents less than 30% of the total printing area for printed dots in a mid-tone region of the tonal scale, fluting or banding effect of an image printed by the relief printing form on corrugated paperboard is at least minimized. This shoulder surface area can surprisingly be achieved when producing a digital plate in an environment having a concentration of oxygen less than atmospheric oxygen but greater than an environment that is completely free of oxygen or greater than an environment composed completely of an inert gas. The present invention provides a relief printing form with the capability for improved printing image quality on corrugated paperboard over relief printing forms made by conventional methods of digital workflow, and even analog workflow. The present invention also avoids the cost and production disadvantages associated with analog workflow, and capitalizes on the efficiencies of digital workflow while avoiding the difficulty of establishing a completely inert environment. The present invention may also provide improvements in the printing performance of the printing form for long-term printing runs by reducing the potential for dot chipping, i.e., where raised printing surfaces wear or break off from the printing form.

A method for providing a relief printing form from a photosensitive element includes forming an in-situ mask adjacent the photopolymerizable layer, exposing the photopolymerizable layer to actinic radiation through the mask in an environment having an inert gas and a concentration of oxygen between 190,000 and 100 parts per million (ppm), and treating to form the relief printing form having a pattern of printing areas. An environment having an inert gas and a concentration of oxygen less than 100 ppm can be achieved and can provide the desired result in the printing surface of the printing form, but is not commercially practical since the period of time needed to purge and create the environment with the inert gas and oxygen concentration less than 100 ppm can significantly extend production time. The atmospheric environment includes about 21% oxygen, about 78% nitrogen, and about 1% other gases. In most embodiments, the atmospheric environment typically surrounding the photosensitive element is purged or substantially purged with an inert gas and results in an environment (for imagewise exposure of the photosensitive element) that has the inert gas and the concentration of oxygen between 190,000 and 100 parts per million (ppm). The photosensitive element includes a layer of a photopolymerizable material composed of at least a binder, an ethylenically unsaturated compound, and a photoinitiator, on or adjacent a support. The photosensitive element for use in the present invention is not limited, provided that the photosensitive element is capable of having an in-situ mask on or adjacent the photopolymerizable layer. The in-situ mask is an image of opaque areas and transparent areas that is integral or substantially integral with the photosensitive element for imagewise exposure to actinic radiation, and does not need vacuum to assure contact of the mask to the photopolymerizable layer. The in-situ mask avoids the drawbacks associated with generating a separate phototool and using vacuum to assure contact of the phototool to the photosensitive layer when making the relief printing form. Exposure of the photosensitive element having in-situ mask in an environment having an inert gas and a concentration of oxygen between 190,000 and 100 parts per million (ppm) may be referred to herein as a "modified digital workflow".

The in-situ mask image is formed on or disposed above the surface of the photopolymerizable layer opposite the support. The mask is an image that includes opaque areas and transparent or "clear" areas. The opaque areas of the mask prevent the photopolymerizable material beneath from being exposed to the radiation and hence those areas of the photopolymerizable layer covered by the dark areas do not polymerize. The "clear" areas of the mask expose the photopolymerizable layer to actinic radiation and polymerize or crosslink. The mask image of the photosensitive element ultimately creates the pattern of printing areas for the relief printing form. The in-situ mask can be generated by any suitable method, including digital direct-to-plate methods using laser radiation (often referred to as digital methods or digital workflow), and inkjet application, that is conducted prior to imagewise exposure of the photosensitive element to actinic radiation. In digital direct-to-plate image technology, laser radiation is used to form the in-situ mask of the image for the photosensitive element. Generally, digital methods of in-situ mask formation use the laser radiation to either selectively remove or transfer a radiation opaque layer from or to a surface of the photosensitive element opposite the support. In most embodiments, the presence of the in-situ mask on the photosensitive element does not act as a barrier to oxygen for the photopolymerizable layer. In one embodiment, the photosensitive element does not include a barrier layer to the oxygen environment.

In one embodiment, the photosensitive element initially includes an actinic radiation opaque layer disposed on or above a surface of the photopolymerizable layer opposite the support, and laser radiation imagewise removes, i.e., ablates or vaporizes, the radiation opaque layer to form the in-situ mask. Only the portions of the radiation opaque layer that were not removed from the photosensitive element will remain on the element to create the mask. In another embodiment, the photosensitive element will not initially include the actinic radiation opaque layer. A separate element bearing the radiation opaque layer will form an assemblage with the photosensitive element such that the radiation opaque layer is adjacent the surface of the photosensitive element opposite the support. The assemblage is exposed imagewise with laser radiation to selectively transfer or selectively alter the adhesion balance of the radiation opaque layer and form the mask image on or disposed above the photopolymerizable layer. In this embodiment, only the transferred portions of the radiation opaque layer reside on the photosensitive element forming the in-situ mask. In another embodiment, digital mask formation can be accomplished by imagewise application of the radiation opaque material in the form of inkjet inks on the photosensitive element. Imagewise application of ink-jet ink can be directly on the photopolymerizable layer or disposed above the photopolymerizable layer on another layer of the photosensitive element. Another contemplated method that digital mask formation can be accomplished is by creating the mask image of the radiation opaque layer on a separate carrier. In some embodiments, the separate carrier includes a radiation opaque layer that is imagewise exposed to laser radiation to selectively remove the radiation opaque material and form the image. The mask image on the carrier is then transferred with application of heat and/or pressure to the surface of the photopolymerizable layer opposite the support.

In some embodiments, the laser radiation used to form the mask is infrared laser radiation. The infrared laser exposure can be carried out using various types of infrared lasers, which emit in the range 750 to 20,000 nm. Infrared lasers including diode lasers emitting in the range 780 to 2,000 nm and Nd:YAG lasers emitting at 1064 nm are preferred. A preferred apparatus and method for infrared laser exposure to imagewise remove the actinic radiation opaque layer from the photosensitive element is disclosed by Fan et al. in U.S. Pat. Nos. 5,760,880 and 5,654,125. The in situ mask images remain on the photosensitive element for the subsequent step of overall exposure to actinic radiation (and treating).

The next step of the method to prepare a relief printing form is to overall expose the photosensitive element to actinic radiation through the in-situ mask, that is, imagewise exposure of the element. Imagewise exposure of the photosensitive element to actinic radiation is conducted in an environment that includes the presence of an inert gas and an oxygen concentration of between 190,000 to 100 part per million (ppm). The inert gas is a gas that exhibits no or a low reaction rate with the photosensitive element (that is, inert to the polymerization reaction), and is capable of displacing oxygen in the exposure environment. Suitable inert gases include, but are not limited to, argon, helium, neon, krypton, xenon, nitrogen, carbon dioxide, and combinations thereof. In one embodiment, the inert gas is nitrogen. Imagewise exposure of the photosensitive element in the particular environment of inert gas and oxygen concentration between 190,000 and 100 ppm creates in the printing form a relief structure of a plurality of raised surfaces each having a ink carrying top surface area that is structurally similar to an ink carrying top surface area created in a printing form that was prepared with analog workflow. That is, the top surface area of the raised surfaces in the relief printing form prepared according to the present method is flat or substantially flat, and not rounded as is typical of conventional digital workflow wherein the element is exposed in the presence of atmospheric oxygen. Conventional digital workflow methods imagewise expose the photosensitive element to actinic radiation in air, which is ~78% nitrogen, ~21% oxygen, <1% each argon and carbon dioxide, and trace amounts of other gases. In one embodiment, the photosensitive element does not include any additional layers on top of the in-situ mask, which additional layers may act as a barrier to the environment to the surface being imagewise exposed.

In one embodiment, the photosensitive element can be placed in an enclosure or chamber that is transparent to actinic radiation and adapted for placement on a bed of an exposure unit. One such embodiment of the enclosure is described in co-filed U.S. patent application Ser. No. 12/401,106. In one embodiment, the enclosure can be sealed from external environment (room conditions) and includes an inlet port for introducing the inert gas into the enclosure and an outlet port for purging the air that is initially in the enclosure. A meter for measuring the concentration of oxygen within the enclosure may be located at the exit port.

In some embodiments after the oxygen concentration has reached 190,000 ppm or less in the enclosure imagewise exposure is initiated and the oxygen concentration in the enclosure is continually reduced by continuous introduction of the inert gas into the enclosure. Imagewise exposure can begin when the concentration of oxygen is at or below 190,000 ppm (19%), and continue as the oxygen concentration reduces to less than or equal to 5000 ppm. In other embodiments, imagewise exposure can begin when the oxygen concentration is 1000 ppm and continue until the oxygen concentration reaches about 100 ppm. In some embodiments, the environment for the photosensitive element during exposure has a concentration of oxygen that is an average of the oxygen concentration at the start of the imagewise exposure and the oxygen concentration at the end of the imagewise exposure. In other embodiments, the environment for the photosensitive element during imagewise exposure has a concentration of oxygen that is a weighted average of the oxygen concentration based on the percentage of time of the total exposure time. In some embodiments, the environment has an average oxygen concentration of less than or equal to 80,000 ppm. In other embodiments, the environment has an average oxygen concentration of less than or equal to 30,000 ppm. In some embodiments after the oxygen concentration has reached 190,000 ppm or less in the enclosure, the oxygen concentration in the environment in the enclosure is maintained or substantially maintained by continuously purging with a combination of the inert gas and oxygen at the desired concentration.

The photosensitive element of the present invention is exposed through the mask to actinic radiation from suitable sources. The actinic radiation exposure time can vary from a few seconds to minutes, depending upon the intensity and spectral energy distribution of the radiation, its distance from the photosensitive element, the desired image resolution, and the nature and amount of the photopolymerizable composition. Exposure temperatures are preferably ambient or slightly higher, i.e., about 20° C. to about 35° C. Exposure is of sufficient duration to crosslink the exposed areas down to the support or to the back exposed layer, i.e., floor. Imagewise exposure time is typically much longer than backflash exposure time, and ranges from a few to tens of minutes.

Actinic radiation sources encompass the ultraviolet and visible wavelength regions. The suitability of a particular actinic radiation source is governed by the photosensitivity of the initiator and the at least one monomer used in preparing the flexographic printing plates. The preferred photosensitivity of most common flexographic printing plates are in the UV and deep UV area of the spectrum, as they afford better room-light stability. Examples of suitable visible and UV sources include carbon arcs, mercury-vapor arcs, content fluorescent lamps, electron flash units, electron beam units, lasers, and photographic flood lamps. Examples of industry standard radiation sources include the Sylvania 350 Black-light fluorescent lamp (FR48T12/350 VLNHO/180, 115 w), and the Philips UV-A "TL"-series low-pressure mercury-vapor fluorescent lamps. In some embodiments, a mercury vapor arc or a sunlamp can be used. In other embodiments, a high-ultraviolet content fluorescent lamp can be used at a distance of about 1 to about 10 inches (about 2.54 to about 25.4 cm) from the photosensitive element. These radiation sources generally emit long-wave UV radiation between 310-400 nm.

In some embodiments, the method to make the relief printing form includes a back exposure or backflash step. This is a blanket exposure to actinic radiation through the support. It is used to create a layer of polymerized material, or a floor, on the support side of the photopolymerizable layer and to sensitize the photopolymerizable layer. The floor provides improved adhesion between the photopolymerizable layer and the support, helps highlight dot resolution and also establishes the depth of the plate relief. The backflash exposure can take place before, after or during the other imaging steps. Any of the conventional radiation sources discussed above for the overall (imagewise) actinic radiation exposure step can be used for the backflash exposure step. Exposure time generally range from a few seconds up to a few minutes. In some embodiments, a floor for may be included in the photosensitive element when the photosensitive element is produced, and so a separate backflash exposure may not be necessary.

Following overall exposure to UV radiation through the mask, the photosensitive printing element is treated to remove unpolymerized areas in the photopolymerizable layer and thereby form a relief image. The treating step removes at least the photopolymerizable layer in the areas which were not exposed to actinic radiation, i.e., the unexposed areas or uncured areas, of the photopolymerizable layer. Except for the elastomeric capping layer, typically the additional layers that may be present on the photopolymerizable layer are removed or substantially removed from the polymerized areas of the photopolymerizable layer. In some embodiments of the photosensitive elements having an in-situ mask, the treating step also removes the mask image (which had been exposed to actinic radiation) and the underlying unexposed areas of the photopolymerizable layer.

Treating of the photosensitive element includes (1) "wet" development wherein the photopolymerizable layer is contacted with a suitable developer solution to washout unpolymerized areas and/or (2) "dry" development wherein the photosensitive element is heated to a development temperature which causes the unpolymerized areas of the photopolymerizable layer to melt or soften or flow and then are removed. Dry development may also be called thermal development. It is also contemplated that combinations of wet and dry treatment can be used to form the relief.

Wet development can be carried out at room temperature but usually is carried out at about 80 to 100° F. The developers can be organic solvents, aqueous or semi-aqueous solutions, and water. The choice of the developer will depend primarily on the chemical nature of the photopolymerizable material to be removed. Suitable organic solvent developers include aromatic or aliphatic hydrocarbon and aliphatic or aromatic halohydrocarbon solvents, or mixtures of such solvents with suitable alcohols. Other organic solvent developers have been disclosed in published German Application 38 28 551. Suitable semi-aqueous developers usually contain water and a water miscible organic solvent and an alkaline material. Suitable aqueous developers usually contain water and an alkaline material. Other suitable aqueous developer combinations are described in U.S. Pat. No. 3,796,602.

Development time can vary based on the thickness and type of the photopolymerizable material, the solvent being used, and the equipment and its operating temperature, but it is preferably in the range of about 2 to about 25 minutes. Developer can be applied in any convenient manner, including immersion, spraying and brush or roller application. Brushing aids can be used to remove the unpolymerized portions of the element. Washout can be carried out in an automatic processing unit which uses developer and mechanical brushing action to remove the uncured portions of the plate, leaving a relief constituting the exposed image and the floor.

Following treatment by developing in solution, the relief printing plates are generally blotted or wiped dry, and then more fully dried in a forced air or infrared oven. Drying times and temperatures may vary based on equipment design, air flow, plate material, however, typically the plate is dried for 60 to 120 minutes at 60° C. High temperatures are not recommended because the support can shrink and this can cause registration problems.

Treating the element thermally includes heating the photosensitive element having at least one photopolymerizable layer (and the additional layer/s) to a temperature sufficient to cause the uncured portions of the photopolymerizable layer to liquefy, i.e., soften or melt or flow, and removing the uncured portions. The layer of the photosensitive composition is capable of partially liquefying upon thermal development. That is, during thermal development the uncured composition must soften or melt at a reasonable processing or developing temperature. If the photosensitive element includes one or more additional layers on the photopolymerizable layer, it is desirable (but necessary) that the one or more additional layers are also removable in the range of acceptable developing temperatures for the photopolymerizable layer. The polymerized areas (cured portions) of the photopolymerizable layer have a higher melting temperature than the unpolymerized areas (uncured portions) and therefore do not melt, soften, or flow at the thermal development temperatures. The uncured portions can be removed from the cured portions of the composition layer by any means including air or liquid stream under pressure as described in U.S. publication 2004/0048199 A1, vacuum as described in Japanese publication 53-008655, and contacting with an absorbent material as described in U.S. Pat. No. 3,060,023; U.S. Pat. No. 3,264,103; U.S. Pat. No. 5,015,556; U.S. Pat. No. 5,175,072; U.S. Pat. No. 5,215,859; U.S. Pat. No. 5,279,697; and U.S. Pat. No. 6,797,454. A preferred method for removing the uncured portions is by contacting an outermost surface of the element to an absorbent surface, such as a development medium, to absorb or wick away or blot the melt portions.

The term "melt" is used to describe the behavior of the unirradiated (uncured) portions of the composition layer subjected to an elevated temperature that softens and reduces the viscosity to permit absorption by the absorbent material. However throughout this specification the terms "melting", "softening", and "liquefying" may be used to describe the behavior of the heated unirradiated portions of the composition layer, regardless of whether the composition may or may not have a sharp transition temperature between a solid and a liquid state. A wide temperature range may be utilized to "melt" the composition layer for the purposes of this invention. Absorption may be slower at lower temperatures and faster at higher temperatures during successful operation of the process.

The thermal treating steps of heating the photosensitive element and contacting an outermost surface of the element with development medium can be done at the same time, or in sequence provided that the uncured portions of the photopolymerizable layer are still soft or in a melt state when contacted with the development medium. The at least one photopolymerizable layer (and the additional layer/s) are heated by conduction, convection, radiation, or other heating methods to a temperature sufficient to effect melting of the uncured portions but not so high as to effect distortion of the cured portions of the layer. The one or more additional layers disposed above the photopolymerizable layer may soften or melt or flow and be absorbed as well by the development medium. The photosensitive element is heated to a surface temperature above about 40° C., preferably from about 40° C. to about 230° C. (104-446° F.) in order to effect melting or flowing of the uncured portions of the photopolymerizable layer. By maintaining more or less intimate contact of the development medium with the photopolymerizable layer that is molten in the uncured regions, a transfer of the uncured photosensitive material from the photopolymerizable layer to the development medium takes place. While still in the heated condition, the development medium is separated from the cured photopolymerizable layer in contact with the support layer to reveal the relief structure. A cycle of the steps of heating the photopolymerizable layer and contacting the molten (portions) layer with the development medium can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the development medium to the photopolymerizable layer (while in the uncured portions are melt) may be maintained by the pressing the layer and the development medium together.

Apparatuses suitable for thermally developing the photosensitive element are disclosed by Peterson et al. in U.S. Pat. No. 5,279,697, and also by Johnson et al. in U.S. Pat. No. 6,797,454. The photosensitive element may be placed on a drum or a planar surface in order for thermal treatment to be carried out.

The photosensitive element in all embodiments is in the form of a plate. However, it should be understood that one of ordinary skill in the art could modify each of the disclosed apparatuses to accommodate the mounting of the photosensitive element in the form of a cylinder or a sleeve.

The development medium is selected to have a melt temperature exceeding the melt or softening or liquefying temperature of the unirradiated or uncured portions of the radiation curable composition and having good tear resistance at the same operating temperatures. The selected material withstands temperatures required to process the photosensitive element during heating. The development medium may also be referred to herein as development material, absorbent material, absorbent web, and web. The development medium is selected from non-woven materials, paper stocks, fibrous woven material, open-celled foam materials, porous materials that contain more or less a substantial fraction of their included volume as void volume. The development medium can be in web or sheet form. The development medium should also possess a high absorbency for the molten elastomeric composition as measured by milligrams of elastomeric composition that can be absorbed per square centimeter of the development medium. In some embodiments, the development medium is a non-woven web of nylon or a non-woven web of polyester.

It is also contemplated that the photosensitive element may undergo one or more treating steps to sufficiently remove the uncured portions to form the relief. The photosensitive element may undergo both wet development and dry development, in any order, to form the relief. A pre-development treating step may be necessary to remove one or more of the additional layers disposed above the photopolymerizable layer if such additional layers are not removable by the washout solution and/or by heating.

After the treatment step, the photosensitive element can be uniformly post-exposed to ensure that the photopolymerization process is complete and that the so formed flexographic printing plate will remain stable during printing and storage. This post-exposure step can utilize the same radiation source as the imagewise main exposure. Furthermore, if the surface of the flexographic printing plate is still tacky, detackification treatments may be applied. Such methods, which are also called "finishing", are well known in the art. For example, tackiness can be eliminated by a treatment of the flexographic printing plate with bromine or chlorine solutions. Preferably, detackification is accomplished by exposure to UV radiation sources having a wavelength not longer than 300 nm. This so-called "light-finishing" is disclosed in European Published Patent Application 0 017927 and U.S. Pat. No. 4,806,506. Various finishing methods may also be combined. Typically, the post-exposure and the finishing exposure are done at the same time on the photosensitive element using an exposure device that has both sources of radiation.

The relief printing form provides a relief structure that includes a plurality of raised surfaces from the floor, where each of the raised surfaces has an ink-carrying top surface area. The relief printing form produced in the modified digital workflow in the environment having an inert gas and an oxygen concentration of between 190,000 ppm and 100 ppm, provides a shape to the raised surfaces that minimizes the fluting effect when used to print on substrates such as corrugated paperboard. The shape of the raised surfaces is determined by the ink carrying top surface area, a side-wall surface area, and a shoulder surface area which is the transition between the top surface area and the side-wall surface area. For each raised surface, the total printing area capable of contacting the substrate to transfer the ink is the sum of the top surface area and the shoulder surface area, and relates to the pressure between the substrate and the relief printing form.

In the present invention for raised surfaces having a dot area of about 30% of a total pixel area (based on the screen resolution of the image), the shape of the raised surface is such that the ink transferred to the substrate under pressure by the shoulder surface area is less than or equal to 30% of the total printing area. The fluting effect is reduced as the contribution of the shoulder area to the total printing area is reduced. In some embodiments, the ink transferred to the substrate by the shoulder surface area is less than or equal to 25% of the total printing area. In other embodiments, the ink transferred to the substrate by the shoulder surface area is less than or equal to 20% of the total printing area. In some embodiments, the ink transferred to the substrate by the shoulder surface area is less than or equal to 15% of the total printing area. In some embodiments, the ink transferred to the substrate by the shoulder surface area is less than or equal to 10% of the total printing area. In some embodiments, the ink transferred to the substrate by the shoulder surface area is less than or equal to 5% of the total printing area.

While the shape of the raised surface is somewhat similar to the shape of the raised surface in relief printing forms made in analog workflow, that is, generally conical with a relatively flat ink carrying top surface area that sharply transitions through the shoulder to the side-wall surface area, the contribution by the shoulder surface area to the total printing area by the relief printing form of the present invention can be substantially different for the observed reduced level of fluting in the printed image.

Figure 1A:
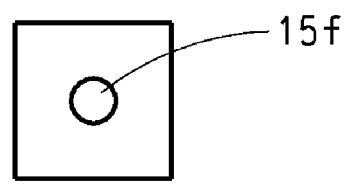
FIG. 1A is a schematic representation of an image taken by the optical device of the raised surface on the relief printing form.

Common imaging techniques, such as a microscope or optical devices, are used to determine the observed dot area. One example of a suitable optical device is a Betaflex flexo analyzer unit, from Beta Industries (Carlstadt, N.J.), which captures the raised structure of a relief printing form as an image for measurement and analysis of relief characteristics such as dot area, screen ruling, and dot quality. As shown in FIG. 1, when utilizing the aforementioned optical devices, a plate 10 having a relief structure 12 of raised surfaces 15 is illuminated with a light source 22 from a bottom side 18 of the plate, and the light passes though the plate 10 to the microscope objective or optical device detector 24. The raised surface 15, typically referred to as dot structure, includes a flat portion 15a, a shoulder portion 15b, and a sidewall portion 15c. Due to the geometry of the raised surface 15, light passes, depicted as vector(s) A, through the flat portion 15a of the raised surface and is collected by the detector 24. Light striking the shoulder portion 15b and the sidewall portions 15c of the raised surface 15 of the relief structure 12, depicted as vector(s) B, are refracted away from the objective or detector 24. As a result, the observed or measured dot size of the raised surface 15 relates to the flat portion 15a of the dot structure. Other optical devices may illuminate and detect in an opposite manner, that is illuminate from the top side of the plate, and detect transmitted light on the opposite side of the plate, but the dot size measured is still the flat portion of the dot structure. FIG. 1A represents an image taken by the optical device of the flat portion 15a of the raised surface 15, showing the observed dot area 15f. While these types of optical measurements are accurate in determining the flat portion 15a of the relief printing surface, they do not accurately capture the shoulder portion 15b of the raised surface.

In printing of corrugated board substrates, the printing surface of the raised surface 15 not only includes the flat portion 15a of the dot, but also at least a portion of the dot shoulder 15b. Thus, the effective dot area not only includes the observed dot area but some portion of the dot shoulder that is likely to come in contact with the substrate during printing. The shape of the dot shoulder 15b, that is the transition from the flat portion 15a to the sidewall portion 15c, influences the portion that will likely contact the substrate.

Assuming equal plate durometer, impression pressure, and substrate compliance, a comparison of printing onto corrugated board substrate using a relief printing form having raised surfaces with rounded shoulders, i.e., gradual transition from top printing surface to sidewall, relative to a relief printing form having raised surfaces with very sharp shoulders, i.e., rapid transition from top printing surface to sidewall, can be determined by considering the increase in printing surface as the pressure applied to the printing form increases.

Figure 2:
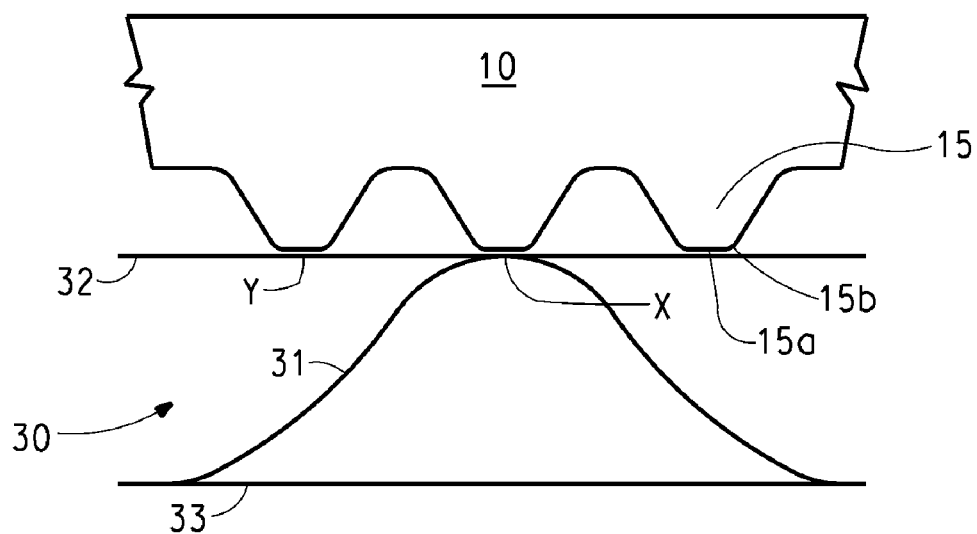
FIG. 2 is an elevation view of a relief printing plate having raised surfaces with dot shoulders that are rounded, and pressed against a corrugated board substrate.
Figure 2A:
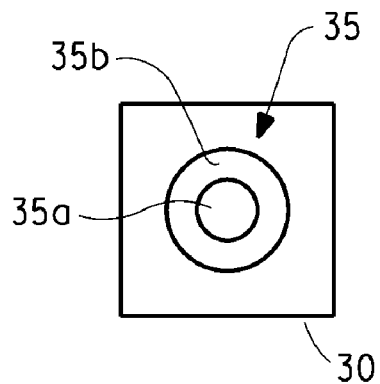
FIG. 2A is a schematic representation of a dot image of one of the raised surfaces having the rounded dot shoulders of FIG. 2, onto a supported portion of a corrugated board substrate.
Figure 2B:
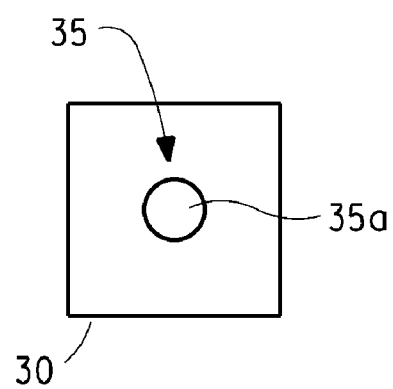
FIG. 2B is a schematic representation of a dot image of one of the raised surfaces having the rounded dot shoulders of FIG. 2, onto a non-supported portion of a corrugated board substrate.

FIG. 2 shows a relief printing plate 10 having raised surfaces 15 with dot shoulders 15b that are rounded, and pressed against a corrugated board substrate 30 having a fluted layer 31 between two liner layers 32, 33. At location X, the fluted layer 31 contacts the top liner layer 32 and provides additional support to the top liner layer 32. The support of the fluted layer 31 applies additional pressure to the printing structure causing more of the dot shoulder area to also transfer ink and creating an inked region on the corrugated substrate of an area larger than the flat portion of the dot surface 15a. FIG. 2A represents the inked image 35 of the raised portion 15 in which the flat portion 15a and the rounded shoulder portion 15b transferred ink portions 35a and 35b onto the corrugated board substrate 30 at a location X. The ink image 35 observed represents a resultant dot size of 15b. At location Y where the top liner layer 32 is not supported by fluted layer 31, less pressure is applied to the printing structure and the inked region 35a on the corrugated substrate 30 corresponds more directly to the to flat portion 15a of the printing surface. FIG. 2B represents the inked image 35 of the raised portion 15 in which the flat portion 15a transferred ink portions 35a onto a (unsupported region) corrugated board substrate at the location Y. In this case of printing onto corrugated board, significant density differences can be observed and measured correlating to the regions supported and unsupported by the fluted layer, resulting in the printing artifact commonly referred to as fluting.

Figure 3:
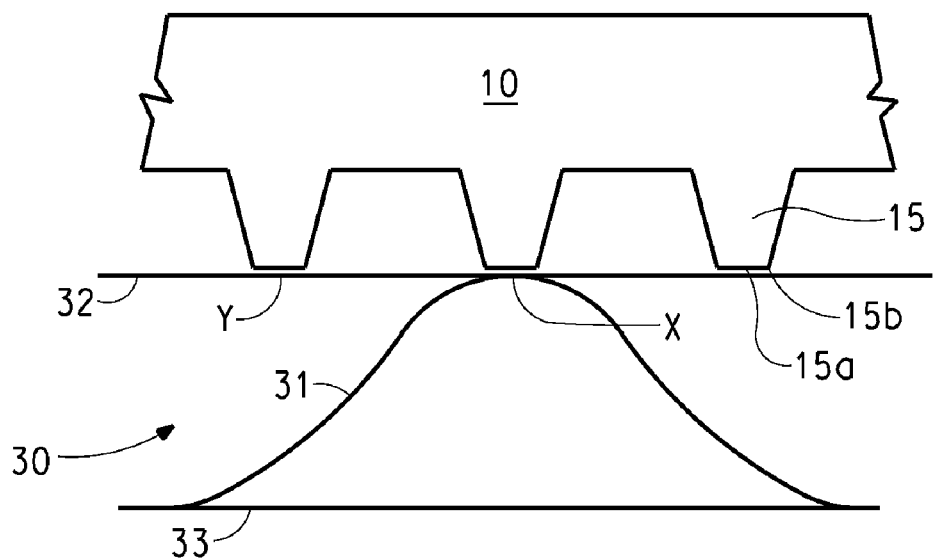
FIG. 3 is an elevation view of a relief printing plate having raised surfaces with dot shoulders that are sharp, and pressed against a corrugated board substrate.
Figure 3A:
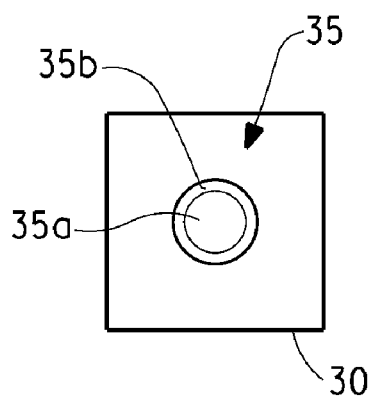
FIG. 3A is a schematic representation of a dot image of one of the raised surfaces having the sharp dot shoulders of FIG. 3, onto a supported portion of a corrugated board substrate.
Figure 3B:
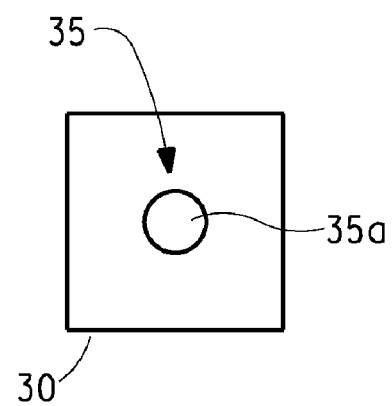
FIG. 3B is a schematic representation of a dot image of one of the raised surfaces having the sharp dot shoulders of FIG. 3, onto a non-supported portion of a corrugated board substrate.

FIG. 3 shows a relief printing plate 10 having raised surfaces 15 with dot shoulders 15b that are sharp, and pressed on a corrugated board substrate 30 having a fluted layer 31 between two liner layers 32, 33. At location X where the fluted layer 31 provides additional support to the top liner layer 32, additional pressure is applied to the printing structure. The dot shoulder 15b also transfers ink but the shoulder is much smaller and the inked region 35 correspondingly smaller. The inked image 35 on the corrugated substrate is only slightly larger than the flat portion of the dot surface 15a. FIG. 3A represents the inked image 35 of the raised portion 15 in which the flat portion 15a and the sharp shoulder portion 15b transferred ink portions 35a and 35b onto a corrugated board substrate 30 at a location X. At location Y where the top liner 32 is not supported by fluted layer 31, less pressure is applied and the inked region 35 on the corrugated substrate 30 corresponds more directly to the flat portion 15a of the printing surface. FIG. 3B represents the inked image 35 of the raised portion 15 in which the flat portion 15a transferred ink portions 35a onto a (unsupported region) corrugated board substrate at the location Y. Since the density difference (created by the raised portions 15) between the supported and unsupported regions of the corrugated substrate is considerably smaller, the fluting printing artifact is minimized, or in some cases eliminated.

In general, the fluting printing artifact can be observed on corrugated paperboard substrates to a greater or lesser extent throughout the entire printed tonal range scale from 1% dots where the inked area is a fraction of the total area to solid printed areas. However, in some embodiments the printed mid-tone region of the tonal scale, that is from about 30 to about 70% printed dot area, tends to most effectively illustrate fluting. In other embodiments, the printed quarter-tone region, that is about 10 to about 30% printed dot area, can effectively illustrate fluting. It should be understood that the tonal scale percentages representing such printed mid-tone and quarter-tone regions is the range generally accepted by those skilled in the art, but not considered a established or binding standard.

The shape of the raised surfaces of a printing plate formed during the photopolymerization (i.e., imagewise exposure in a limited oxygen concentration) and subsequent processing steps has been shown to differ based on the process used to fabricate the printing plate. In particular, the shape of the raised surfaces produced by the present process differ from the shape of the raised surfaces produced by the traditional analog process and the traditional digital process. A method has been established to evaluate the shape of the raised surfaces of a printing plate specifically quantifying the area (expressed as a percent of the total area) of the printing surface that would come in contact with the substrate during the printing process.

Given that the common imaging techniques that are used to determine the observed dot area as described above are not sufficient to describe the effective printing dot area of relief structure, a more accurate method is used to determine suitable dot structures for printing on corrugated board. The method should capture not only the observed dot area (flat portion), but also the dot shoulder region and to some extent the dot sidewall region). The method for evaluating the shape of the raised surface 15 involves measuring the printing plate surface by any one of a number of methods including surface profilimetry, optical interferometry, three dimensional optical microscopy or any such method that will provide a measure with sufficient resolution of the surface profile across a given surface area of a representative sample of material. In particular, the measurement process should generate the Z-axis data (height) for all X and Y locations in the region of interest. This information can be used to generate a cumulative sum of the area of a printing plate surface, such as the raised portions, from its uppermost regions to the floor region of the plate.

Figure 4A:
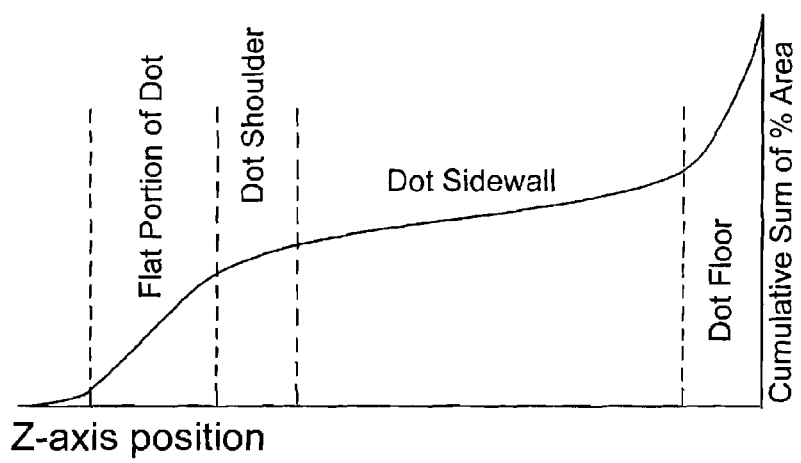
FIGS. 4A, 4B, and 4C each is a schematic representation of a curve of a cumulative sum of an area relative to height of a raised surface of a relief structure separately graphed for each of three printing forms that are prepared by different workflow processes.
Figure 4B:
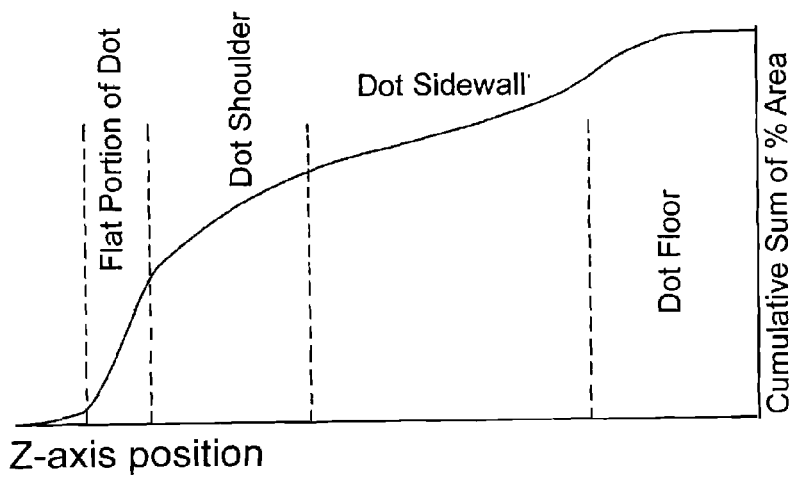
Figure 4C:
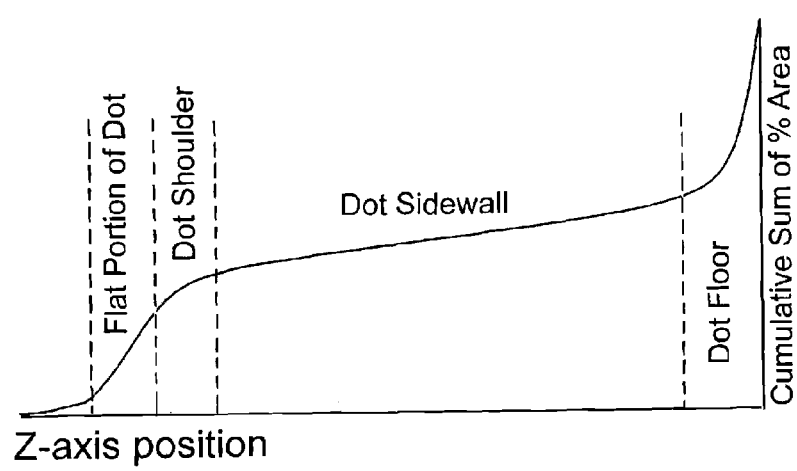

FIGS. 4A, 4B, and 4C show a separate curve of the cumulative sum of the percent area relative to height (z-axis position) of a raised surface of a relief structure for each of three printing forms prepared by different workflow processes. The curve of FIG. 4A is a depiction of the cumulative sum of a raised portion created in a plate prepared by the analog workflow process (imagewise exposure through phototool under vacuum). The curve of FIG. 4B is a depiction of the cumulative sum of a raised portion created in a plate prepared by the digital workflow process (imagewise exposure through an in-situ mask in the presence of atmospheric oxygen). The curve of FIG. 4C is a depiction of the cumulative sum of a raised portion created in a plate prepared by the present workflow process of imagewise exposure through an in-situ mask in an atmosphere of inert gas and oxygen between 190000 to 100 ppm. The curves shown in FIGS. 4A, 4B, and 4C can be used to describe the printing element structure, i.e., raised portions, specifically the flat portion of the printing surface is defined by the region of the curve where the area grows rapidly, and the sidewall portion of the printing element being defined by the straight line portion of the curve where the cumulative area grows less rapidly. The transition region between these two regions defines the shoulder of the printing element. The final region defined is the non-printing area referred to as the floor where the raised surface structures are attached to the bulk plate material. The curve of FIG. 4A and the curve of FIG. 4C are similar, but the curve of FIG. 4A is characterized by a slower transition from the flat portion to the sidewall portion of the printing element structure (raised portion). The curve of FIG. 4B represents a very different printing element structure (raised portion) with an extended region of transition between the flat portion of the printing surface and the sidewall portion.

This analysis can be used to estimate the impact impression pressure will have on the surface area of the printing element that comes in contact with the anilox roller or substrate during the printing process. The surface area will be affected by a number of variables including physical plate properties such as durometer, plate mounting materials, anilox characteristics and other print conditions. As these factors can be minimized or eliminated, the present three-dimensional analysis of the raised surface provides a method for estimating the impact of impression pressure on the effective printing surface area. At minimum impression pressure only the very top of the flat portion of the raised dot surface contacts the substrate. As the pressure increases, the flat portion of the raised dot surface contacts the substrate, and at over impression pressure a greater surface area of the raised dot surface than the flat portion, which includes some or all of the shoulder portion, contacts the substrate. At over impression, regions other than the top printing surface of the dot can contact the substrate including the shoulder, dot sidewall, and in extreme cases the entire regions between the raised dot surfaces. In most embodiments, it is desirable to print at slightly above minimum impression pressure, often referred to in the industry as kiss impression, in which only the flat portion of the raised dot surface contacts the substrate to achieve optimum uniform solids across the printed image on the substrate. As such, for an identical change in impression pressure the cumulative surface area that would come in contact during the printing process is significantly greater for materials characterized by curve B than for materials characterized by curve A. Also, of the same identical change in impressing pressure the cumulative surface area that would come in contact during the printing process is least for materials characterized by curve C.

Since critical elements for each of the raised portion of the relief structure can be described by the curve of the cumulative sum of the percent area, the raised surface and resultant printing area can be determined by other descriptors. The point of maximum slope (first derivative reaches a maximum or when the second derivative crosses zero) represents the point at which the uppermost printing surface is defined. The flat line portion of the curve (second derivative approaches zero—for this analysis it was identified as the point where the second derivative is within 0.0005 of zero following the first derivative maxima) represents the end of the shoulder of the dot structure where it transitions to the sidewall portion. The second derivative is representative of the effective dot area under pressure.

Rather than express the shoulder area as a percentage of the dot diameter as measured by a microscope, it is also possible to express the shoulder area as the increase in radius (or diameter) of the dot from its top surface area. The top surface area or diameter of a raised dot surface can be determined from measurement with optical microscope as described above. The effective printing area (dot area) under pressure of the raised dot surface, as measured by surface profilimetry, optical interferometry, or three dimensional optical microscopy as described above, can be converted to a dot diameter that includes the shoulder portion, based upon the total pixel area determined from the screen resolution. It has been discovered that a printing form will have acceptable print performance (on corrugated paperboard) for a given dot size when under pressure (e.g., kiss impression pressure) in which the radius of the raised dot surface increases or grows less than or equal to about 10% of the radius of the flat portion of the raised dot surface upon contact to the substrate. In some embodiments, a printing form prepared according the present invention will have acceptable print performance (on corrugated paperboard) for a given dot size when under pressure (e.g., kiss impression pressure) in which the radius of the raised dot surface increases or grows less than or equal to about 5% of the radius of the flat portion of the raised dot surface upon contact to the substrate. In other embodiments, a printing form prepared according the present invention will have acceptable print performance (on corrugated paperboard) for a given dot size when under pressure (e.g., kiss impression pressure) in which the radius of the raised dot surface increases or grows less than or equal to about 2% of the radius of the flat portion of the raised dot surface upon contact to the substrate. In some other embodiments, a printing form prepared according the present invention will have acceptable print performance (on corrugated paperboard) for a given dot size when under pressure (e.g., kiss impression pressure) in which the radius of the raised dot surface increases or grows less than or equal to about 1% of the radius of the flat portion of the raised dot surface upon contact to the substrate.

It has been determined for a raised dot surface of about 155 micron in diameter that when the radius of the raised dot surface increased or grew less than about 10 microns (due to the influence of the shoulder portion during printing) under pressure, the printing form has acceptable print performance, i.e., acceptable degree of fluting, on corrugated paperboard. In some embodiments when the radius of the raised dot surface (of about 155 micron diameter) increased or grew less than about 8 microns (due to the influence of the shoulder portion during printing) under pressure, the printing form printed images with a low level of fluting, on corrugated paperboard. In some embodiments when the radius of the raised dot surface (of about 155 micron diameter) increased or grew less than about 5 microns (due to the influence of the shoulder portion during printing) under pressure, the printing form printed images with very low or no degree of fluting on corrugated paperboard. In some embodiments when the radius of the raised dot surface (of about 155 micron diameter) increased or grew less than about 2 microns (due to the influence of the shoulder portion during printing) under pressure, the printing form printed images with very low or no degree of fluting on corrugated paperboard. Although Printing Method The steps of mounting the relief printing form on a printing press, inking the printing areas (that is, the raised portions of the relief surface) of the printing form, and contacting the inked printing areas to the substrate to transfer the pattern of ink onto the substrate are not limited, and encompass various conventional and non-conventional practices for mounting, inking, and contacting to print as is known to those skilled in the art of flexographic printing. The Fourth Edition published in 1992, and the Fifth Edition, published in 1999, of Flexography: Principles and Practice, published by the Foundation of Flexographic Technical Association, (Ronkonkoma, N.Y.) are suitable sources representing the field of knowledge in many aspects of flexographic printing. In particular, the chapters on mounting and proofing, the printing press, inks, flexographic printing plates, and substrates, are most applicable to the present invention.

Mounting of the relief printing form onto a printing cylinder or other support in a printing press can be accomplished in any manner. In some embodiments, the printing form can be mounted directly onto the printing cylinder or other press support with an adhesive, typically is double-sided adhesive tape. In other embodiments, the printing form can be mounted onto a carrier sheet with the double-sided adhesive tape. Attached to a leading end of the carrier sheet is a mounting bar which mates with a slot in the printing cylinder to thereby secure the carrier with the printing form to the printing cylinder. In other embodiments, the printing form can be mounted onto a sleeve support with double-sided adhesive tape. The sleeve support is then mounted onto the printing cylinder in most embodiments by sufficiently expanding the support with air so that the support can slide onto the cylinder and has an interference fit once the air is removed. One or more relief printing forms can be mounted on the printing cylinder or carrier. In some embodiments, the relief form is the same dimension as the precursor photosensitive element. In other embodiments, the relief printing form is a segment, sometimes referred to as a slug, of the precursor photosensitive element. In yet other embodiments, the relief printing form is a composite of several segments or slugs mounted onto an intermediate such as the carrier or sleeve. One method for mounting relief printing form onto a printing cylinder is described by Fox et al. in U.S. Pat. No. 5,562,039.

It is desirable to assure the accurate positioning of the relief printing form or forms when mounting onto the print cylinder or onto the intermediate in order for the printed image on the substrate to be registered. The relief printing form should be positioned on the cylinder such that the printing is parallel to the axis of the printing cylinder, that is, not skewed. In multicolor printing, the relief printing form for each color being printed should be aligned so that the different color printed images are registered with each other. Registration errors give rise to superimposed colors, spaces with no color, color shifts, and/or degraded image detail. Mounting of the relief printing form, as well as color registration and proofing, can be conducted off the press by means of commercially available mounting-proofing machines designed for this purpose. These machines, which usually make use of an optical or video mounting system, make it possible to mount the printing forms on the print cylinder to effect color registration, a procedure essential to the maintenance of both quality and economy in all flexographic operations.

Rudolf et al. in U.S. Pat. No. 5,850,789 disclose one embodiment of a means for registering printing forms, in particular planar printing forms (plates), onto a print cylinder. Also, printing plate mounting devices are commercially available from various manufacturers including Microflex (Denmark), Bieffebi S.p.A. (Italy), J. M. Heaford Ltd. (UK), AV Flexologic b.v. (Netherlands), and E. L. Harley, Inc. (U.S.). It should be understood that one of ordinary skill in the art can modify the mounting apparatus disclosed by Rudolf et al. and other such commercial mounting-proofing apparatuses to accommodate the mounting of cylindrically-shaped printing forms. Alternate embodiments of the means for registering the printing form include, but are not limited to, optical spotting devices, for example, as disclosed by Banke in U.S. Pat. No. 4,872,407; reflection mounting devices as in disclosed in EP 015471; U.S. Pat. No. 390,633, U.S. Pat. No. 4,449,452.

Application of ink to the printing areas of the printing form is not limited. Most conventional embodiments for relief printing use an anilox roll to meter the ink onto the printing areas of the relief printing form. The anilox roll is a metering roll that is used to meter a controlled film of ink from a fountain roller to the relief surface of the printing form. The anilox roll can be a metal, metal-coated, or ceramic-coated roll. The anilox roll includes a multiplicity of cells that are mechanically- or laser-engraved into the face of the roll, and that carrying a volume of ink to the printing form.

The ink used in the present invention is not limited and can include fluid inks, such as water-base inks and solvent inks, dye-based inks, pigment-based inks, and paste inks etc. The ink typically includes at least a colorant and a vehicle, and a solvent to adjust the viscosity for suitable printing and drying.

Contacting of the ink from the printing areas of the relief printing form to the substrate transfers the pattern of ink onto the substrate. Transferring may also be referred to as printing. The printing areas of the relief printing form consist of the raised surfaces of the relief structure. In one embodiment, ink is applied to the relief printing form via a metering roller, commonly referred to as an anilox roller, containing pores of defined volume that meter a specific amount of ink to the print form. The print form is then placed in contact with the substrate transferring some portion of the ink from the print form to the substrate. Contacting the ink that resides on the printing areas to the substrate transfers the ink such that the pattern of ink is formed on the substrate when the relief printing form is separated from the substrate. In general, the amount of ink transferred to the substrate is a function of the amount of ink on the printing form, the pressure between the relief printing form and the substrate as well as the image pattern of the relief printing form, and the relief structure of the pattern. Optionally, pressure may be applied to the relief printing form to assure contact and complete transfer of the ink to the substrate. In printing, the pressure suitable for contacting the printing areas to the substrate is usually referred to as an impression setting which is applicable to the particular printing press. Impression settings can include minimum or "kiss" impression setting, and impression settings that apply greater pressure between the print form and the substrate typically defined in terms of the additional distance that one or both the print form and substrate are moved towards each other. In most embodiments, the minimum impression is that impression setting that provides uniform 100% solid ink coverage across the width of the printed substrate. However, commercial printing operations typically do not print with a minimum impression setting.

Contacting the ink to the substrate to transfer the pattern may be accomplished in any manner. Contacting the ink may be by moving the relief printing form to the substrate, or by moving the substrate to the relief printing form, or by moving both the substrate and the relief printing form into contact. In one embodiment, the functional material is transferred manually. The present method typically occurs at room temperature, that is, at temperatures between 17 to 30° C. (63 to 86° F.), but is not so limited.

The substrate has a printable surface that is not uniformly supported, that is, the printable surface is uneven due to portions that are supported and portions that are substantially unsupported, under the printed image area (opposite the printable surface). In one embodiment, the substrate is corrugated paperboard. Corrugated paperboard may also be referred to as corrugated board. Corrugated paperboard includes a corrugating medium, which is a layer of pleated or multi-grooved paperboard typically called flute, adjacent a flat paper or paper-like layer referred to as liner. A typical embodiment of corrugated paperboard includes the flute layer sandwiched between two liner layers. Other embodiments of corrugated paperboard can include multiple layers of flute and liner. The fluted interlayer provides structural rigidity to the corrugated board. Since corrugated paperboard is used as packaging and formed into boxes and containers, the liner layer forming an exterior surface of the corrugated paperboard is frequently printed with the necessary graphic elements for the package. The exterior liner layer often has slight indentations due to the uneven support of the underlying flute layer.

Photosensitive Element

The photosensitive element used for preparing flexographic printing forms includes at least one layer of a photopolymerizable composition. The term "photosensitive" encompass any system in which the at least one photosensitive layer is capable of initiating a reaction or reactions, particularly photochemical reactions, upon response to actinic radiation. In some embodiments, the photosensitive element includes a support for the photopolymerizable layer. In some embodiments, the photopolymerizable layer is an elastomeric layer that includes a binder, at least one monomer, and a photoinitiator. In some embodiments, the photosensitive element includes a layer of an actinic radiation opaque material adjacent the photopolymerizable layer, opposite the support. In other embodiments, the photosensitive element includes an image of actinic radiation opaque material suitable for use as an in-situ mask adjacent the photopolymerizable layer.

Unless otherwise indicated, the term "photosensitive element" encompasses printing precursors capable of undergoing exposure to actinic radiation and treating to form a surface suitable for printing. Unless otherwise indicated, the "photosensitive element" and "printing form" includes elements or structures in any form which become suitable for printing or are suitable for printing, including, but not limited to, flat sheets, plates, seamless continuous forms, cylindrical forms, plates-on-sleeves, and plates-on-carriers. It is contemplated that printing form resulting from the photosensitive element has end-use printing applications for relief printing, such as flexographic and letterpress printing. Relief printing is a method of printing in which the printing form prints from an image area, where the image area of the printing form is raised and the non-image area is depressed.

The photosensitive element includes at least one layer of a photopolymerizable composition. As used herein, the term "photopolymerizable" is intended to encompass systems that are photopolymerizable, photocrosslinkable, or both. The photopolymerizable layer is a solid elastomeric layer formed of the composition comprising a binder, at least one monomer, and a photoinitiator. The photoinitiator has sensitivity to actinic radiation. Throughout this specification actinic light will include ultraviolet radiation and/or visible light. The solid layer of the photopolymerizable composition is treated with one or more solutions and/or heat to form a relief suitable for flexographic printing. As used herein, the term "solid" refers to the physical state of the layer which has a definite volume and shape and resists forces that tend to alter its volume or shape. The layer of the photopolymerizable composition is solid at room temperature, which is a temperature between about 5° C. and about 30° C. A solid layer of the photopolymerizable composition may be polymerized (photohardened), or unpolymerized, or both.

The binder is not limited and can be a single polymer or mixture of polymers. In some embodiments, the binder is an elastomeric binder. In other embodiments, the binder becomes elastomeric upon exposure to actinic radiation. Binders include natural or synthetic polymers of conjugated diolefin hydrocarbons, including polyisoprene, 1,2-polybutadiene, 1,4-polybutadiene, butadiene/acrylonitrile, and diene/styrene thermoplastic-elastomeric block copolymers. In some embodiments, the binder is an elastomeric block copolymer of an A-B-A type block copolymer, where A represents a non-elastomeric block, and B represents an elastomeric block. The non-elastomeric block A can be a vinyl polymer, such as for example, polystyrene. Examples of the elastomeric block B include polybutadiene and polyisoprene. In some embodiments, the elastomeric binders include poly (styrene/isoprene/styrene) block copolymers and poly(styrene/butadiene/styrene) block copolymers. The non-elastomer to elastomer ratio of the A-B-A type block copolymers can be in the range of from 10:90 to 35:65. The binder can be soluble, swellable, or dispersible in aqueous, semi-aqueous, water, or organic solvent washout solutions. Elastomeric binders which can be washed out by treating in aqueous or semi-aqueous developers have been disclosed by Proskow, in U.S. Pat. No. 4,177,074; Proskow in U.S. Pat. No. 4,431,723; Worns in U.S. Pat. No. 4,517,279; Suzuki et al. in U.S. Pat. No. 5,679,485; Suzuki et al. in U.S. Pat. No. 5,830,621; and Sakurai et al. in U.S. Pat. No. 5,863,704. The block copolymers discussed in Chen, U.S. Pat. No. 4,323,636; Heinz et al., U.S. Pat. No. 4,430,417; and Toda et al., U.S. Pat. No. 4,045, 231 can be washed out by treating in organic solvent solutions. Generally, the elastomeric binders which are suitable for washout development are also suitable for use in thermal treating wherein the unpolymerized areas of the photopolymerizable layer soften, melt, or flow upon heating. It is preferred that the binder be present in an amount of at least 50% by weight of the photosensitive composition.

The term binder, as used herein, encompasses core shell microgels and blends of microgels and performed macromolecular polymers, such as those disclosed in Fryd et al., U.S. Pat. No. 4,956,252 and Quinn et al., U.S. Pat. No. 5,707,773.

The photopolymerizable composition contains at least one compound capable of addition polymerization that is compatible with the binder to the extent that a clear, non-cloudy photosensitive layer is produced. The at least one compound capable of addition polymerization may also be referred to as a monomer. Monomers that can be used in the photopolymerizable composition are well known in the art and include, but are not limited to, addition-polymerization ethylenically unsaturated compounds with at least one terminal ethylenic group. Generally the monomers have relatively low molecular weights (less than about 30,000). In some embodiments the monomers have a relatively low molecular weight less than about 5000. Unless otherwise indicated, the molecular weight is the weighted average molecular weight. The addition polymerization compound may also be an oligomer, and can be a single or a mixture of oligomers. Some embodiments include a polyacrylol oligomer having a molecular weight greater than 1000. The composition can contain a single monomer or a combination of monomers. The monomer compound is present in at least an amount of 5%, and in some embodiments 10 to 20%, by weight of the composition.

Suitable monomers include, but are not limited to, acrylate monoesters of alcohols and polyols; acrylate polyesters of alcohols and polyols; methacrylate monoesters of alcohols and polyols; and methacrylate polyesters of alcohols and polyols; where the alcohols and the polyols suitable include alkanols, alkylene glycols, trimethylol propane, ethoxylated trimethylol propane, pentaerythritol, and polyacrylol oligomers. Other suitable monomers include acrylate derivatives and methacrylate derivatives of isocyanates, esters, epoxides, and the like. Combinations of monofunctional acrylates, multifunctional acrylates, monofunctional methacrylates, and/or multifunctional methacrylates may be used. Other examples of suitable monomers include acrylate and methacrylate derivatives of isocyanates, esters, epoxides and the like. In some end-use printing forms it may be desirable to use monomer that provide elastomeric properties to the element. Examples of elastomeric monomers include, but are not limited to, acrylated liquid polyisoprenes, acrylated liquid butadienes, liquid polyisoprenes with high vinyl content, and liquid polybutadienes with high vinyl content, (that is, content of 1-2 vinyl groups is greater than about 20% by weight).

Further examples of monomers can be found in U.S. Pat. No. 2,927,024; Chen, U.S. Pat. No. 4,323,636; Fryd et al., U.S. Pat. No. 4,753,865; Fryd et al., U.S. Pat. No. 4,726,877 and Feinberg et al., U.S. Pat. No. 4,894,315.

The photoinitiator can be any single compound or combination of compounds which is sensitive to actinic radiation, generating free radicals which initiate the polymerization of the monomer or monomers without excessive termination. Any of the known classes of photoinitiators, particularly free radical photoinitiators such as quinones, benzophenones, benzoin ethers, aryl ketones, peroxides, biimidazoles, benzyl dimethyl ketal, hydroxyl alkyl phenyl acetophenone, dialkoxy acetophenone, trimethylbenzoyl phosphine oxide derivatives, aminoketones, benzoyl cyclohexanol, methyl thio phenyl morpholino ketones, morpholino phenyl amino ketones, alpha halogennoacetophenones, oxysulfonyl ketones, sulfonyl ketones, oxysulfonyl ketones, benzoyl oxime esters, thioxanthrones, ketocoumarins, and Michler's ketone may be used. Alternatively, the photoinitiator may be a mixture of compounds in which one of the compounds provides the free radicals when caused to do so by a sensitizer activated by radiation. Preferably, the photoinitiator for the main exposure (as well as post-exposure and backflash) is sensitive to visible or ultraviolet radiation, between 310 to 400 nm, and preferably 345 to 365 nm. A second photoinitiator sensitive to radiation between 220 to 300 nm, preferably 245 to 265 nm, may optionally be present in the photopolymerizable composition. After treating, a plate can be finished with radiation between 220 to 300 nm to detackify the relief surfaces. The second photoinitiator decreases the finishing exposure time necessary to detackify the plate. Photoinitiators are generally present in amounts from 0.001% to 10.0% based on the weight of the photopolymerizable composition.

The photopolymerizable composition can contain other additives depending on the final properties desired. Additional additives to the photopolymerizable composition include sensitizers, plasticizers, rheology modifiers, thermal polymerization inhibitors, colorants, processing aids, antioxidants, antiozonants, dyes, and fillers.

Plasticizers are used to adjust the film forming properties of the elastomer. Examples of suitable plasticizers include aliphatic hydrocarbon oils, e.g., naphthenic and paraffinic oils; liquid polydienes, e.g., liquid polybutadiene; liquid polyisoprene; polystyrene; poly-alpha-methyl styrene; alpha-methylstyrene-vinyltoluene copolymers; pentaerythritol ester of hydrogenated rosin; polyterpene resins; and ester resins. Generally, plasticizers are liquids having molecular weights of less than about 5000, but can have molecular weights up to about 30,000. Plasticizers having low molecular weight will encompass molecular weights less than about 30,000.

The thickness of the photopolymerizable layer can vary over a wide range depending upon the type of printing form desired. In one embodiment, the photosensitive layer can have a thickness from about 0.015 inch to about 0.250 inch or greater (about 0.038 to about 0.64 cm or greater). In another embodiment, the photosensitive layer can have a thickness from about 0.107 inch to about 0.300 inch (about 0.27 to about 0.76 cm). In some embodiments, the photosensitive layer can have a thickness from about 0.020 to 0.067 inch (0.5 mm to 1.7 mm). In yet other embodiments, the photosensitive layer can have a thickness from about 0.002 inch to 0.025 inch (0.051 to 0.64 mm).

The photosensitive element may optionally include a support adjacent the layer of the photosensitive composition. The support can be composed of any material or combination of materials that is conventionally used with photosensitive elements used to prepare printing forms. In some embodiments, the support is transparent to actinic radiation to accommodate "backflash" exposure through the support. Examples of suitable support materials include polymeric films such those formed by addition polymers and linear condensation polymers, transparent foams and fabrics, such as fiberglass. Under certain end-use conditions, metals such as aluminum, steel, and nickel, may also be used as a support, even though a metal support is not transparent to radiation. In some embodiments, the support is a polyester film. In one embodiment, the support is polyethylene terephthalate film. The support may be in sheet form or in cylindrical form, such as a sleeve. The sleeve can be formed of any material or combination of materials conventionally used in forming sleeves for printing. The sleeve can have a single layer, multi-layer, composite, or unitary structure. Sleeves can be made of polymeric films that are typically transparent to actinic radiation and thereby accommodate backflash exposure for building a floor in the cylindrical printing element. Multiple layered sleeves may include an adhesive layer or tape between the layers of flexible material, such as disclosed in U.S. Pat. No. 5,301,610. The sleeve may also be made of non-transparent, actinic radiation blocking materials, such as nickel or glass epoxy. The sleeve may be composed of one or more layers of a resin composition, which can be the same or different, and have fillers and/or fibers incorporated therein. Materials suitable as the resin composition are not limited, examples of which include, epoxy resins; polystyrene and polyvinyl resins, such as polyvinyl chloride and polyvinyl acetate; phenolic resins; and aromatic amine-cured epoxy resins. The fibers used in the resin composition are not limited and can include, for example, glass fibers, aramid fibers, carbon fibers, metal fibers, and ceramic fibers. Fibers incorporated with the sleeve can include continuous, woven, and/or wound materials. The support formed of a resin composition reinforced with fiber is an example of a composite sleeve. In some embodiments, the support has a thickness from 0.002 to 0.050 inch (0.0051 to 0.127 cm). The sleeve can have a wall thickness from about 0.01 and about 6.35 mm or more. In some embodiments, the sleeve has a wall thickness between about 0.25 and 3 mm. In some embodiments, the sleeve has a wall thickness between about 10 to 80 mils (0.25 to 2.0 mm), and in other embodiments 10 to 40 mils (0.25 to 1.0 mm).

Optionally, the element includes an adhesive layer between the support and the photopolymerizable layer, or a surface of the support that is adjacent the photopolymerizable layer has an adhesion promoting surface to give strong adherence between the support and the photopolymerizable layer.

The photopolymerizable layer itself can be prepared in many ways by admixing the binder, monomer, initiator, and other ingredients. It is preferred that the photopolymerizable mixture be formed into a hot melt and then calendered to the desired thickness. An extruder can be used to perform the functions of melting, mixing, deaerating and filtering the composition. To achieve uniform thickness, the extrusion step can be advantageously coupled with a calendering step in which the hot mixture is calendered between two sheets, such as the support and a temporary coversheet, or between one flat sheet and a release roll. Alternately, the material can be extruded/calendered onto a temporary support and later laminated to the desired final support. The element can also be prepared by compounding the components in a suitable mixing device and then pressing the material into the desired shape in a suitable mold. The material is generally pressed between the support and the coversheet. The molding step can involve pressure and/or heat. The coversheet may include one or more of the additional layers which transfer to the photopolymerizable layer when the photosensitive element is formed. Cylindrically shaped photopolymerizable elements may be prepared by any suitable method. In one embodiment, the cylindrically shaped elements can be formed from a photopolymerizable printing plate that is wrapped on a carrier or cylindrical support, i.e., sleeve, and the ends of the plate mated to form the cylinder shape. The cylindrically shaped photopolymerizable element can also be prepared according to the method and apparatus disclosed by Cushner et al. in U.S. Pat. No. 5,798,019.

The photosensitive element includes at least one photopolymerizable layer, and thus can be a bi- or multi-layer construction. The photosensitive element may include one or more additional layers on or adjacent the photosensitive layer. In most embodiments the one or more additional layers are on a side of the photosensitive layer opposite the support. Examples of additional layers include, but are not limited to, a protective layer, a capping layer, an elastomeric layer, a barrier layer, and combinations thereof. The one or more additional layers can be removable, in whole or in part, during treatment. One or more of the additional layers may cover or only partially cover the photosensitive composition layer.

The protective layer protects the surface of the composition layer and can enable the easy removal of a mask material used for the imagewise exposure of the photosensitive element. The photosensitive element may include an elastomeric capping layer on the at least one photopolymerizable layer. The elastomeric capping layer is typically part of a multilayer cover element that becomes part of the photosensitive printing element during calendering of the photopolymerizable layer. Multilayer cover elements and compositions suitable as the elastomeric capping layer are disclosed in Gruetzmacher et al., U.S. Pat. No. 4,427,759 and U.S. Pat. No. 4,460,675. In some embodiments, the composition of the elastomeric capping layer includes an elastomeric binder, and optionally a monomer and photoinitiator and other additives, all of which can be the same or different than those used in the bulk photopolymerizable layer. Although the elastomeric capping layer may not necessarily contain photoreactive components, the layer ultimately becomes photosensitive when in contact with the underlying bulk photopolymerizable layer. As such, upon imagewise exposure to actinic radiation, the elastomeric capping layer has cured portions in which polymerization or crosslinking have occurred and uncured portions which remain unpolymerized, i.e., uncrosslinked. Treating causes the unpolymerized portions of the elastomeric capping layer to be removed along with the photopolymerizable layer in order to form the relief surface. The elastomeric capping layer that has been exposed to actinic radiation remains on the surface of the polymerized areas of the photopolymerizable layer and becomes the actual printing surface of the printing plate.

The actinic radiation opaque layer is employed in digital direct-to-plate image technology in which laser radiation, typically infrared laser radiation, is used to form a mask of the image for the photosensitive element (instead of the conventional image transparency or phototool). The actinic radiation opaque layer is substantially opaque to actinic radiation that corresponds with the sensitivity of the photopolymerizable material. Digital methods create a mask image in situ on or disposed above the photopolymerizable layer with laser radiation. Digital methods of creating the mask image require one or more steps to prepare the photosensitive element prior to imagewise exposure. Generally, digital methods of in-situ mask formation either selectively remove or transfer the radiation opaque layer, from or to a surface of the photosensitive element opposite the support. The actinic radiation opaque layer is also sensitive to laser radiation that can selectively remove or transfer the opaque layer. In one embodiment, the actinic radiation opaque layer is sensitive to infrared laser radiation. The method by which the mask is formed with the radiation opaque layer on the photosensitive element is not limited.

In one embodiment, the photosensitive element may include the actinic radiation opaque layer disposed above and covers or substantially covers the entire surface of the photopolymerizable layer opposite the support. In this embodiment the infrared laser radiation imagewise removes, i.e., ablates or vaporizes, the radiation opaque layer and forms an in-situ mask as disclosed by Fan in U.S. Pat. No. 5,262,275; Fan in U.S. Pat. No. 5,719,009; Fan in U.S. Pat. No. 6,558,876; Fan in EP 0 741 330 A1; and Van Zoeren in U.S. Pat. Nos. 5,506,086 and 5,705,310. A material capture sheet adjacent the radiation opaque layer may be present during laser exposure to capture the material as it is removed from the photosensitive element as disclosed by Van Zoeren in U.S. Pat. No. 5,705,310. Only the portions of the radiation opaque layer that were not removed from the photosensitive element will remain on the element forming the in-situ mask.

In some embodiments, the actinic radiation opaque layer comprises a radiation-opaque material, an infrared-absorbing material, and an optional binder. Dark inorganic pigments, such as carbon black and graphite, mixtures of pigments, metals, and metal alloys generally function as both infrared-sensitive material and radiation-opaque material. The optional binder is a polymeric material which includes, but is not limited to, self-oxidizing polymers; non-self-oxidizing polymers; thermochemically decomposable polymers; polymers and copolymers of butadiene and isoprene with styrene and/or olefins; pyrolyzable polymers; amphoteric interpolymers; polyethylene wax, materials conventionally used as a release layer, such as polyamides, polyvinyl alcohol, hydroxyalkyl cellulose, and copolymers of ethylene and vinyl acetate; and combinations thereof. The thickness of the actinic radiation opaque layer should be in a range to optimize both sensitivity and opacity, which is generally from about 20 Angstroms to about 50 micrometers. The actinic radiation opaque layer should have a transmission optical density of greater than 2.0 in order to effectively block actinic radiation and the polymerization of the underlying photopolymerizable layer.

In another embodiment for digitally forming the in-situ mask, the photosensitive element will not initially include the actinic radiation opaque layer. A separate element bearing the radiation opaque layer will form an assemblage with the photosensitive element such that the radiation opaque layer is adjacent the surface of the photosensitive element opposite the support, which is typically is the photopolymerizable layer. (If present, a coversheet associated with the photosensitive element typically is removed prior to forming the assemblage.) The separate element may include one or more other layers, such as ejection layers or heating layers, to aid in the digital exposure process. Hereto, the radiation opaque layer is also sensitive to infrared radiation. The assemblage is exposed imagewise with infrared laser radiation to selectively transfer or selectively alter the adhesion balance of the radiation opaque layer and form the image on or disposed above the photopolymerizable layer as disclosed by Fan et al. in U.S. Pat. No. 5,607,814; and Blanchett in U.S. Pat. Nos. 5,766,819; 5,840,463; and EP 0 891 877 A. As a result of the imagewise transfer process, only the transferred portions of the radiation opaque layer will reside on the photosensitive element forming the in-situ mask.

In another embodiment, digital mask formation can be accomplished by imagewise application of the radiation opaque material in the form of inkjet inks on the photosensitive element. Imagewise application of an ink-jet ink can be directly on the photopolymerizable layer or disposed above the photopolymerizable layer on another layer of the photosensitive element. Another contemplated method that digital mask formation can be accomplished is by creating the mask image of the radiation opaque layer on a separate carrier. In some embodiments, the separate carrier includes a radiation opaque layer that is imagewise exposed to laser radiation to selectively remove the radiation opaque material and form the image. The mask image on the carrier is then transferred with application of heat and/or pressure to the surface of the photopolymerizable layer opposite the support. The photopolymerizable layer is typically tacky and will retain the transferred image. The separate carrier is then removed from the element prior to imagewise exposure.

The photosensitive printing element may also include a temporary coversheet on top of the uppermost layer of the element, which is removed prior to preparation of the printing form. One purpose of the coversheet is to protect the uppermost layer of the photosensitive printing element during storage and handling. Examples of suitable materials for the coversheet include thin films of polystyrene, polyethylene, polypropylene, polycarbonate, fluoropolymers, polyamide or polyesters, which can be subbed with release layers. The coversheet is preferably prepared from polyester, such as Mylar® polyethylene terephthalate film.

The printing form, after exposure (and treating) of the photosensitive element, has a durometer of about 20 to about 85 Shore A. The Shore durometer is a measure of the resistance of a material toward indentation. Durometer of Shore A is the scale typically used for soft rubbers or elastomeric materials, where the higher the value the greater the resistance toward penetration. In one embodiment, the printing form has a Shore A durometer less than about 50 to about 20. In another embodiment, the printing form has a Shore A durometer less than about 40 to about 25. In another embodiment, the printing form has a Shore A durometer less than about 35 to about 30. Printing forms having a Shore A durometer less than about 40 are particularly suited for printing on corrugated paperboard. The durometer of the printing form can be measured according to standardized procedures described in DIN 53,505 or ASTM D2240-00. In some embodiments, the printing form can be mounted onto a carrier having the same or different resilience than that of the printing form. The resilience of the carrier can influence the overall resilience of the overall print form package (that is, carrier and printing form) resulting in a durometer of the package different from that of the printing form.

GLOSSARY

"Mask opening" is the "clear" area of an integral mask to allow exposure to actinic radiation of the underlying photopolymerizable material. (In some embodiments, the clear area is created by removal of actinic radiation opaque material from the element. In other embodiments, the clear area is created non-transfer of actinic radiation opaque material to the element.) Mask opening is measured with a measuring microscope. The effective mask opening area is calculated by measuring the area of the opening and dividing by the total pixel area defined by the screen resolution in lines per inch (LPI). The total pixel area is calculated using the equation $(1/LPI)^2$ and the effective mask opening is defined as the (opening area)/$(1/LPI)^2$. The mask opening is typically expressed as a percentage (of total pixel area).

"Phototool opening" is the area of the phototool that is transparent to actinic radiation expressed as a percentage of the total pixel area and is calculated similar to the above mask opening area.

"Optical Density" or simply "Density" is the degree of darkness (light absorption or opacity) of a image, and can be determined from the following relationship:

Density=$\log_{10}$ {1/reflectance} where reflectance is {intensity of reflected light/intensity of incident light}

"Dot size on plate" is a measure of the diameter of the dot commonly assessed using a calibrated microscope or specialized optical apparatus. The measurement typically represents accurately the flat portion of the dot structure on the plate.

"Dot area on plate" or "plate dot area" is commonly expressed as a percentage and is generally calculated by converting the dot size to an area (area=$\pi r^2$) and dividing by the total pixel area as defined by the screen resolution.

"Effective Printed Dot Area" is a calculated quantity based on the density measurements of region printed with a regular array of dots of uniform size called a tint area and density measurements of a printed region with complete ink coverage (also referred to as 100% coverage or solid coverage). The equation used is called the Murray Davies equation and is represented below:

Effective printed dot area=$(1-10^{-Dt})/(1-10^{-Ds})$ where Dt=tint density and Ds=solid density "Effective printing area (dot area) under pressure" is the dot area on the plate expressed as a percent of the total area that will come in contact with the substrate to be printed when the plate and substrate are in intimate contact with each other and when the plate/substrate exert pressure on each other.

"Plate to Print Dot Gain" represents the growth in the printed dot area from the dot area on plate expressed as a percentage of the total pixel area, to the effective printed dot area expressed as a percentage of coverage area. This is simply the difference between the two.

EXAMPLES

CYREL® photopolymerizable printing plates, CYREL® Digital Imager, CYREL® exposure unit, CYREL® processor, and CYREL® Cylosol developing solution are all available from The DuPont Company (Wilmington, Del.).

Example 1

All plates tested were CYREL® photopolymerizable printing elements having total thickness of 125 mils (3.175 mm) (which includes the thickness of the photopolymerizable layer and the support) that are suitable for use as a flexographic printing plate. The photopolymerizable printing element included a layer of a photopolymerizable composition comprising elastomeric binder, at least one monomer, and photoinitiator between a support of Mylar® (5 mils) and a coversheet (7 mils). For analog plates, the coversheet included a release layer of polyamide, which was adjacent the photopolymerizable layer. For digital plates, the coversheet included an infrared-sensitive, actinic radiation opaque layer composed of 33% carbon black and 67% polyamide (by weight), which was adjacent the photopolymerizable layer.

Each element was backflash exposed to UV light (365 nm) for 85 seconds (17.6 mjoules/cm$^2$/sec) on a CYREL® exposure unit to form a floor. After imagewise exposure, each element was developed in organic solvent, CYREL® Cylosol washout solution for 8.9 minutes in a CYREL® 1000P type processor to remove the unexposed areas and form a relief printing plate. The plate was then dried for 2 hours in a convection oven. After drying, the plate was further exposed to UV light (254 nm) on the exposure unit for 5 minutes to light finish the plate, eliminating any residual tackiness.

Each element was imagewise exposed through a test target image to UV light (365 nm) as described below. The test target image was designed to be essentially the same for the phototool used in the analog workflow and for the in-situ mask formed adjacent the photopolymerizable layer used in the digital workflow. The test target image incorporated a number of sufficiently large patches of varying percent print area representing ink tint percentages from 2% to 100% to ensure that patches of identical dot size on the plate were available regardless of the plate production workflow and to allow for sufficient area to quantify fluting performance. The test target image also included a solid ink density bar across a leading edge to assure impression uniformity on the press (printed) sheet, several patches for assessing exposure uniformity, positive and reverse type, and line targets.

For Plate A, a CYREL® photopolymer printing element, type TDR, was exposed and processed as described above using analog workflow. For the back exposure, instead of 85 seconds the exposure time was 113 seconds at 17.6 mjoules/cm$^2$/sec. For the imagewise exposure, the coversheet was removed, an image-bearing negative (i.e., phototool having the test target as previously described) was placed on a surface of the element opposite the support and vacuum was drawn, and was exposed to UV radiation for 15 minutes (17.6 mjoules/cm$^2$/sec) on the exposure unit.

For each of Plate B and Plate C, a printing element was prepared from a CYREL® photopolymer printing element, type TDR, for the photopolymerizable layer onto which was laminated an infrared-sensitive, actinic radiation opaque layer (instead of the release layer). Each of the Plate B and Plate C was exposed and processed as described above using digital workflow. The coversheet was removed, and an in-situ mask of the test target was formed on the element by imagewise ablating the infrared-sensitive actinic radiation opaque layer with infrared laser radiation in a CYREL® Digital Imager, Model SPARK 4835 Optics 40, from ESKO Graphics Imaging GmbH (Itzehoe, Germany). As is known to those of ordinary skill in the art of digital platemaking, the digital file of the mask image can be adjusted in order to compensate for oxygen inhibition and printed dot gain typically associated with plates made by digital workflow. As such, appropriate 'bump' and compensation curves can be applied to the digital file of the mask image to create the mask image for digital plates. For Plate B, the digital file of the mask image was appropriately bumped by about 4%. For Plate C, the digital file of the mask image was not adjusted with any bump and compensation curves due to the exposure environment, i.e., modified digital workflow environment.

For imagewise exposure of Plate B, the element was placed in the exposure unit and exposed to UV radiation through the in-situ mask for about 16 minutes (33.9 mjoules/cm$^2$/sec) in air (having atmospheric oxygen concentration of 21% (210,000 ppm)).

For imagewise exposure of Plate C, a CYREL® 2001 ECLF exposure unit was modified to include a UV transparent enclosure that resides on the exposure bed of the unit and sealed along its perimeter to provide desired conditions within the enclosure for the element during imagewise exposure. One embodiment of such an enclosure is described in co-filed U.S. application Ser. No. 12/401,106. The enclosure included an inlet port for introducing an inert gas, which in this Example is nitrogen, into the enclosure and an outlet port for purging the initial air (that includes oxygen) from the enclosure. The concentration of oxygen exiting the enclosure was measured with a trace oxygen analyzer, model Series 3000, from Alpha Omega Instruments (Cumberland, R.I.), which was located at and plumbed to the outlet port of the enclosure. Plate C was located on the exposure bed so that it was encased within the enclosure having its environment of primarily nitrogen gas with some oxygen concentration during UV exposure. In this Example, Plate C was exposed to UV radiation through the in-situ mask for about 20 minutes (33.9 mjoules/cm$^2$/sec) in the primarily nitrogen environment with continuous reduction of oxygen concentration. Exposure began when the concentration of the oxygen within the enclosure was about 1,000 ppm (0.1% oxygen) and continued while nitrogen gas was continuously introduced into the enclosure to reduce the concentration of oxygen to less than about 100 ppm when the exposure ended.

For each Plates A through C, a measuring microscope (Nikon Measurescope, model MM-11, from NIKON (USA) (Melville, N.Y.)) was used to measure dot size in the patch areas of the plate. The relief structure of the printing plate included raised portions and recessed portions. Each patch representing a particular % print area in the mask included a plurality or raised portions of the same size. The raised portions, which carry ink to the substrate being printed, are typically referred to as dots. Microscope analysis determined the patch that was closest to a 30% area coverage, that is, the patch that provides flat raised surfaces having a diameter of about 157 micron for each dot, based on line screening at 100 lines per inch. For the purposes of this example, the plate dot area of 30% was chosen as a basis of comparison for the 3 plates A through C, because the mid-tone region of the tint scale tends to very effectively illustrate fluting. Comparative analysis of the plates A through C, would expectedly remain substantially the same at other selected plate dot areas.

| Workflow | Mask or Phototool Opening | Dot diameter (micron) | Dot Area on Plate |
|---|---|---|---|
| Plate A | Analog | 28% | 155.4 | 29.4% |
| Plate B | digital workflow; exp. in atmospheric oxygen | 50% | 158.7 | 30.7% |
| Plate C | digital workflow; exp. in nitrogen atmosphere with less than 190,000 ppm oxygen | 30% | 157.8 | 30.3% |

Printing of Plates

Plates A through C were each mounted with double-sided tape to a polyester-reinforced cushioned carrier (R/bac foam, type SF, 0.060 inch from Rogers Corp.), which had a mounting lead edge strip attached to its leading end. The carrier was then mounted onto a print cylinder by securing the mounting lead edge strip to a groove in the print cylinder and securing a trailing end of the carrier to the cylinder in a Bobst Flexo 160 printing press. The plates were inked with an anilox roll that was a 500 line screen with a volume of 3.0 billion cubic microns per square inch (BCMI) at 60 degrees. The ink used was a water-based BCM ink having 9.5 pH and a viscosity of 15.4 seconds with 4 DIN cup. The plates printed the ink printed a pattern of ink according to the relief image onto corrugated paperboard that was Kemiart B-flute 200# coated. The plate was set to print at impression settings of minimum (kiss) contact, +0.010 inch, and +0.020 inch over impression.

Evaluation and Analysis

For each Plate A through C, patches that corresponded to the 30% plate tint area (i.e., dot area on plate) and those that correspond to an equal density of 0.40±0.03 on the printed substrate were analyzed. These areas were then identified on the printed corrugated board and a 3.5 inch square sample was removed from the board for density measurement analysis on an X-RITE Spectrodensitometer, model 528, from X-RITE, Inc., (Grandville, Mich.). Multiple measurements were taken and spaced to ensure density readings spanned both fluted and non-fluted regions in the printed image. The density measurements were converted into % dot area coverage using the Murray Davies equation to enable calculation of actual dot gain (printed dot area−plate dot area).

The printed image on corrugated board was evaluated for fluting effect which manifests as regions of dark printing, i.e., bands of higher ink coverage resulting in a higher density reading, alternating with regions of light printing, i.e., bands of lower in coverage (or less than high) resulting in lower ink density reading, that correspond to the underlying fluting structure of the corrugated paperboard. Rankings were determined by providing unlabeled samples to a panel of ten knowledgeable observers and having each independently rank the fluting performance from best to worst, on a scale of 1 to 10 where 1 represents the best flute performance, and 10 represents the worst flute performance. An average fluting ranking is provided based on patches that represent approximately equal plate dot areas (based on the microscope analysis of the dot diameter) as well as patches that represent approximately equal density values (based on the density measurements). Plate to Print gain refers to the increase in dot size from the plate dot area (which in this example is at an approximately equal plate dot area of 30%) to the dot area effectively printed on the corrugated substrate.

| | Effective Printed Dot Area | Plate to Print Gain | Fluting Rank based on Ave. Area | Fluting Rank based on Ave. Density |
|---|---|---|---|---|
| Plate A | 62.8% | 33.4% | 5.4 | 4.1 |
| Plate B | 72.6% | 41.9% | 6.3 | 7.4 |
| Plate C | 56.4% | 26.1% | 2.9 | 2.3 |

The fluting exhibited in the image printed by Plate A is consistent with and representative of the level of fluting performance considered acceptable by the flexographic printing industry for printing on corrugated board. While Plate B has the same physical properties as Plate A, Plate B differs in that it was made using digital workflow. Plates equivalent to Plate B have been evaluated in corrugated printing market, and have not been accepted due to its poor fluting performance. As such, the fluting exhibited by the image printed by Plate B would not be acceptable to the corrugated board printing industry. Plate C represents the same material as Plate B, however Plate C was made using the modified digital workflow of the present invention as described above using particular environment during exposure. The fluting exhibited in the image printed by Plate C had the lowest fluting effect compared to that of Plates A and B having the least ink density differences between supported and unsupported regions of the corrugated board, and was a significant improvement in terms of reduced level of fluting from the image printed by Plate A that is currently industry acceptable, and even greater improvement from the image printed by Plate B made by digital workflow. Plate C which was exposed in a modified digital workflow produced plate to press dot gains significantly lower than both Plate A made by conventional analog workflow and Plate B than conventional digital workflow (exposure in air).

Each of Plates A through C, underwent three dimensional (3D) structural analysis using a Hirox microscope, model KH-770, from Hirox-USA (River Edge, N.J.)). The 3D microscope generates an image 1600×1200 microns (X by Y) with a dimension of 0.517 microns per pixel. The Z-axis (height of dot) data for each X,Y position was captured in order to characterize the 'printing region' of the dot. This data was loaded into a spreadsheet software package to generate a cumulative sum of Z-axis data (area by height) effectively slicing successive layers of the plate structure from the top surface down in the minus Z direction.

Three-dimensional analysis showed that while all three plates had a relatively flat printing area, Plate A and Plate C had a significantly different relief structure than Plate B. The raised portions or dots of Plate A and Plate C had a top surface area that was relatively flat, and a shoulder area that sharply transitioned from the top surface area of the dot to a supporting sidewall of the dot. The raised portions or dots of Plate B had the top printing surface of the dot and a shoulder that much more gradually transitioned to the sidewall of the dot.

The surface area of the raised surface of the plate as a percent of the total surface area was calculated as a function of depth (Z axis position) and related to the surface area of the plate that came into contact with the substrate as pressure between the substrate and the printing plate was applied (effective dot printing area under pressure). In addition, the second derivative of the cumulative sum of the percent surface area of the raised surface, i.e., dots, for each of the Plates A through C was taken to determine the effective dot printing area under pressure. As a result of the differences in plate structures described above, the effective plate area coming in contact with the substrate under pressure varied dramatically.

Plate A, generally regarded as very acceptable for fluting in the corrugated board printing industry, had effective printing area under pressure of 38%. This represents a growth over the area measured using the microscope of 8.6% and that growth represents an increase of approximately 29% over the original size. Plate B, regarded as poor for fluting performance, exhibits a 60% effective printing area under pressure. This represents an increase, i.e., growth, of about 29% over the printed area measured using a microscope, and represents an increase of about 96% over the original size. Plate C, ranked significantly better for fluting exhibits a 32% effective dot area under pressure. This represents an increase (i.e., growth) of less than 2% over the printed area measured using a microscope, and represents an increase of 5.6% over the original size.

These results are consistent with the ranking of the printed images described above.

| | Effective Print Area Under Pressure | Meas. Dot Area on Plate | Difference* | Difference as a Percent of Dot Area on Plate |
|---|---|---|---|---|
| Plate A | 38% | 29.4% | 8.6% | 29.3% |
| Plate B | 60% | 30.7% | 29.3% | 95.7% |
| Plate C | 32% | 30.3% | 1.7% | 5.6% |

*Difference is the (Effective Print Area under Pressure) less the (Measured Dot Area on Plate).

Rather than express the shoulder area as a percentage of the dot diameter as measured by a microscope, the shoulder area may also be expressed as an increase in radius (or diameter) of the dot from its essentially flat top printing surface area. The effective printing area (dot area) under pressure as measured by the Hirox microscope was converted to a dot diameter that includes the shoulder portion (based upon the second derivative calculation of the transition from the shoulder portion to the sidewall portion using the curve of the cumulative surface area). The Example showed that performance is best, i.e., reduced fluting, when the radius of the dot increased less than about 2 microns (Plate C), and has been acceptable if the radius increased up to approximately 10 microns (Plate A), but is clearly unsatisfactory when the radius increased over 30 microns (Plate B), for a dot size between 155 to 160 micron representing 30% print area at 100 lines/inch resolution. The same or substantially the same results were observed for other sizes of dots each representing a different percent print area of the tonal range.

| | Dot Diameter of Plate (Optical Microscope) Microns | Dot Diameter Including Shoulder (Hirox Microscope) Microns | Difference between (Dot Diameter including Shoulder) and (Dot Diameter of Plate) Microns | Shoulder Width (additional radial distance) Microns |
|---|---|---|---|---|
| Plate A | 155.4 | 176.7 | 21.3 | 10.7 |
| Plate B | 158.7 | 222.0 | 63.3 | 31.7 |
| Plate C | 157.8 | 162.1 | 4.3 | 2.1 |

What is claimed is:

1. A method for printing a pattern of ink on a corrugated paperboard substrate comprising:

a) providing a relief printing form from a photosensitive element comprising a photopolymerizable layer containing a binder, an ethylenically unsaturated compound and a photoinitiator, with steps comprising:

i) forming an in-situ mask adjacent the photopolymerizable layer;

ii) exposing the photopolymerizable layer to actinic radiation through the mask in an environment having an inert gas and a concentration of oxygen between 190,000 ppm and 100 ppm; and iii) treating the element from step ii) to form the relief printing form having a pattern of printing areas;

b) securing the printing form onto or adjacent a print cylinder;

c) applying the ink to the printing areas of the printing form; and d) contacting the ink from the printing areas to the substrate, thereby transferring the pattern of ink onto the substrate.

2. The method of claim 1 further comprising continuously reducing the concentration of oxygen during the exposing step.

3. The method of claim 2 wherein the exposing step is completed when the concentration of oxygen is less than or equal to 5000 ppm.

4. The method of claim 1 wherein the exposing step is performed in an environment having an average concentration of oxygen during the exposing step less than or equal to 80,000 ppm.

5. The method of claim 1 wherein the exposing step is performed in an environment having an average concentration of oxygen during the exposing step less than or equal to 30,000 ppm.

6. The method of claim 1 wherein the printing form comprises a plurality of raised surfaces where each of the raised surfaces has an ink-carrying top surface area.

7. The method of claim 6 wherein each of the raised surfaces further comprises a side-wall surface area and a shoulder surface area that transitions between the top surface area and the side-wall surface area, and each of the raised surfaces has a total printing area that is the sum of the top surface area and the shoulder surface area, wherein the ink transferred to the substrate by each shoulder surface area is less than or equal to 30% of the total printing area.

8. The method of claim 6 wherein the raised surface is a dot area is between 30% to 70% of a total pixel area.

9. The method of claim 7 wherein the ink transferred to the substrate by each shoulder surface area is less than 25% of the total printing area.

10. The method of claim 7 wherein the ink transferred to the substrate by each shoulder surface area is less than 10% of the total printing area.

11. The method of claim 7 wherein the ink transferred to the substrate by each shoulder surface area is less than 5% of the total printing area.

12. The method of claim 6 wherein each of the raised surfaces further comprises a side-wall surface area and a shoulder surface area that transitions between the top surface area and the side-wall surface area, and wherein the top surface area has a radius and upon contacting the shoulder surface area increases the radius of the top surface area by less than or equal to about 10%.

13. The method of claim 12 wherein upon contacting the shoulder surface area increases the radius of the top surface area by less than or equal to about 5%.

14. The method of claim 12 wherein upon contacting the shoulder surface area increases the radius of the top surface area by less than or equal to about 1%.

15. The method of claim 1 wherein the relief printing form after step iii) has a Shore A durometer of between 20 and 85.

16. The method of claim 1 wherein the relief printing form after step iii) has a Shore A durometer of between 30 and 35.

17. The method of claim 1 wherein the treating step (iii) is selected from the group consisting of:
   (iii-a) processing the element with at least one washout solution selected from the group consisting of solvent solution, aqueous solution, semi-aqueous solution, and water; and
   (iii-b) heating the element to a temperature sufficient to cause areas to melt, flow, or soften.

18. The method of claim 1 wherein the forming the in-situ mask step (i) is selected from the group consisting of;
   (i-a) imagewise exposing a laser-radiation sensitive layer on or adjacent the photopolymerizable layer to infrared laser radiation to form the in-situ mask above the photopolymerizable layer; and
   i-b) imagewise applying an actinic radiation opaque material on or above the composition layer to form the in-situ mask.

* * * * *